(12) United States Patent
Kim

(10) Patent No.: US 7,378,747 B2
(45) Date of Patent: May 27, 2008

(54) SEMICONDUCTOR DEVICE CHIP AND SEMICONDUCTOR DEVICE CHIP PACKAGE

(75) Inventor: Jong-Kee Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 225 days.

(21) Appl. No.: 11/429,973

(22) Filed: May 9, 2006

(65) Prior Publication Data

US 2006/0255468 A1 Nov. 16, 2006

(30) Foreign Application Priority Data

May 11, 2005 (KR) .................... 10-2005-0039197

(51) Int. Cl.
*H01L 23/48* (2006.01)
*H01L 23/52* (2006.01)
*H01L 29/40* (2006.01)

(52) U.S. Cl. .............. 257/786; 257/778; 257/707

(58) Field of Classification Search ............ 257/786, 257/778, 758, 706, 707, 780, 781, 207, 208, 257/210

See application file for complete search history.

(56) References Cited

U.S. PATENT DOCUMENTS

| 4,795,077 | A  | * | 1/1989  | Geyer et al. .................. 228/106 |
| 2002/0053726 | A1 | * | 5/2002  | Mikubo et al. .............. 257/685 |
| 2005/0218432 | A1 | * | 10/2005 | Matsuzaki et al. ........... 257/266 |
| 2006/0102957 | A1 | * | 5/2006  | Liaw ........................... 257/368 |
| 2006/0110859 | A1 | * | 5/2006  | Shigemura et al. .......... 438/125 |

* cited by examiner

*Primary Examiner*—S. V. Clark
(74) *Attorney, Agent, or Firm*—Morgan, Lewis & Bockius LLP

(57) ABSTRACT

A semiconductor device chip includes channel blocks each of which includes channels, each of the channels including unit devices placed in a substrate and well regions; first metal interconnection lines connected to the unit devices comprising the channels to receive and transfer data signals from and to the external side; normal bumps for transferring the data signals received by the first metal interconnection lines through first external interconnection lines to be connected to the external side; second metal interconnection lines placed between the channel blocks, each of the second metal interconnection lines being connected to one of the substrate and a corresponding well region; and first heat transfer bumps placed over the second metal interconnection lines to receive the heat generated during driving the channel blocks through the second metal interconnection lines and transfer the received heat to second external interconnection lines to be connected to the external side.

46 Claims, 21 Drawing Sheets

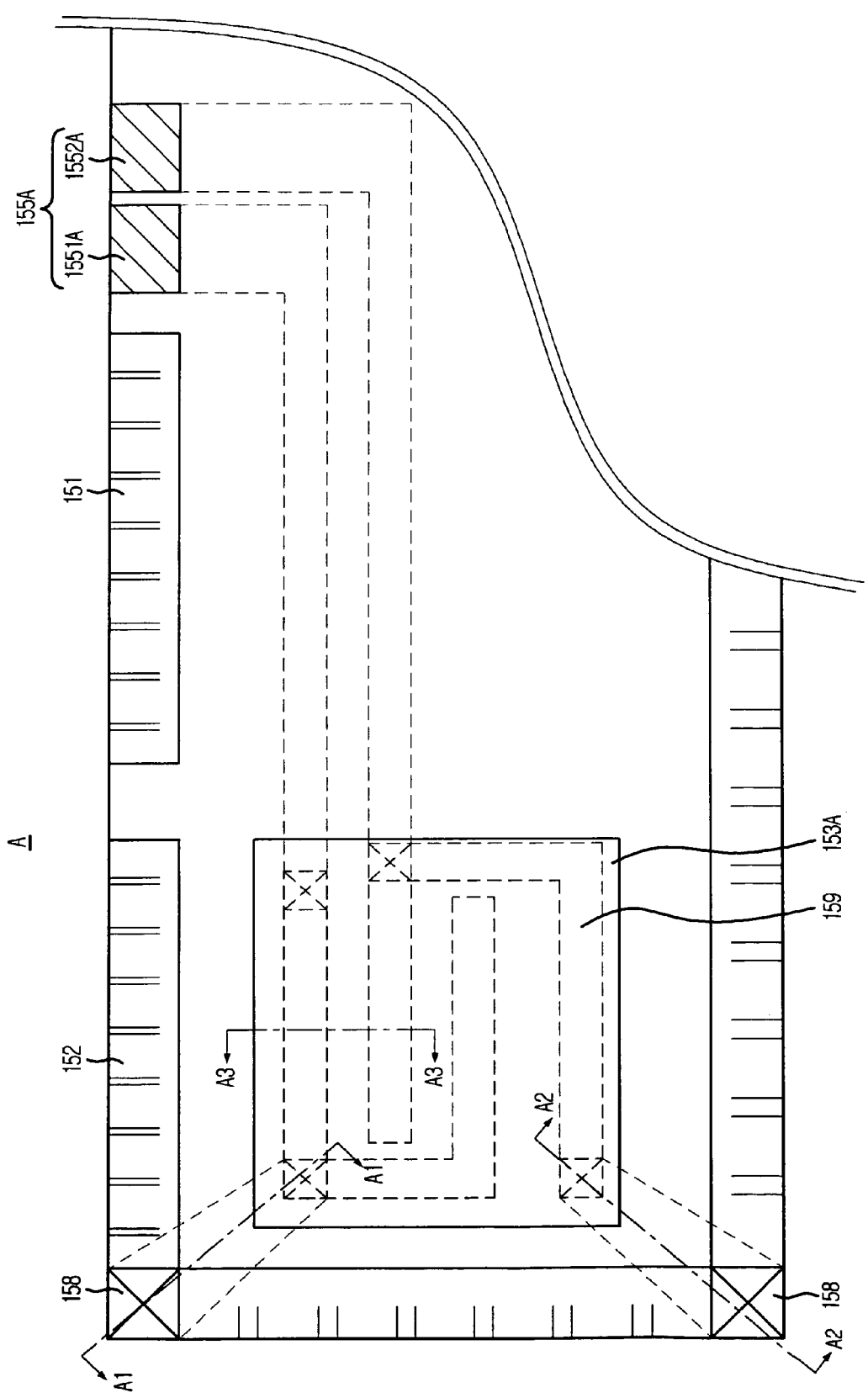

A1-A1

A2-A2

A3-A3

A4-A4

SEMICONDUCTOR DEVICE CHIP AND SEMICONDUCTOR DEVICE CHIP PACKAGE

FIELD OF THE INVENTION

The present invention relates to a semiconductor chip and a semiconductor chip package; and more particularly, to a display driver integrated circuit (DDI) chip connected to a flat panel display (FPD) module to drive a displaying apparatus such as a liquid crystal display (LCD), and a package thereof.

DESCRIPTION OF RELATED ARTS

As an infocomindustry, a computer industry, and a display industry have been rapidly developed, there has been a continuous trend toward a high functionality, a low price, and a low electric power with respect to electric parts used in the above mentioned industries. An effort to make electric appliances slim and light by using these electric parts has also continuously progressed. This effort can be realized by using a semiconductor device as a core part. That is, as an integration circuit of a semiconductor device has been micronized, the scale of integration of the semiconductor device becomes increased and the semiconductor device becomes to have high performances. Furthermore, a packaging technology including a new installing method has been developed, thereby leading a rapid development in the electric parts and electric appliance industry.

The packaging technology makes a semiconductor chip electrically connected to an external terminal, and protects the inside of the semiconductor chip from the outside. A connection process and a molding process have been developed and applied to a conventional packaging process to efficiently serve the above described purposes of the packaging process. However, as the kind of the electric appliances using the semiconductor device has been increased, and the size, the type, and the capability of the semiconductor chip used in the electric appliances have been various, a packaging method of a semiconductor device including the connection process and the molding process has been changed.

A dual inline package (DIP), a small outline package (SOP), a quad flat package (QFP), a ball grid array (BGA), and a new packaging type, i.e., a chip scale package (CSP), are widely used to install a semiconductor chip in high density. Also, a direct chip attach (DCA) installing technology with respect to a CSP of a wafer level and a bare chip is in development to fabricate slim and light electric appliances.

Furthermore, a flip chip technology has been developed to meet diversification of applications and to embody installation with high density. The flip chip technology broadly means a technology for electrically and mechanically connecting a semiconductor chip and a substrate in a state pads of the semiconductor chip face to the substrate by flipping the semiconductor chip. Also, the flip chip technology narrowly means a bare chip package technology as a term corresponding to the CSP of the wafer level. Hereinafter, the flip chip technology denotes the flip chip technology explained in a broad sense.

The flip chip technology includes a tape carrier package (TCP) technology, a chip on film (COF) package technology, and a chip on glass (COG) technology. The COF package technology installs a semiconductor chip on a film type substrate. The COG package installs a semiconductor chip on a panel of a glass substrate type.

FIG. 1A is a top view illustrating a typical COF package to explain the COF package technology, and FIG. 1B is a cross-sectional view illustrating the COF package shown in FIG. 1A.

As shown in FIGS. 1A and 1B, the typical COF package 10 uses a film substrate 12 as an installation substrate where a plurality of thin film copper interconnection lines 13 forming a predetermined circuit are formed. A semiconductor chip 11 is installed over the film substrate 12 by a bump bonding. In other words, a plurality of bumps 14 are formed on the semiconductor chip 11 and then, each of the bumps 14 is placed to face to the thin film copper interconnection lines 13. Afterwards, a predetermined pressure is applied to join the bumps 14 and the thin film interconnection lines 13, thereby completing the package.

FIG. 2A is a top view illustrating a COG package to explain the typical COG package technology and FIG. 2B is a cross-sectional view illustrating the COG package shown in FIG. 2A.

As shown in FIGS. 2A and 2B, the typical COG package 20 is embodied by using a similar installing method to the method used in the typical COF package. However, when compared to the COF package 10 using the film substrate 12 as the installation substrate, the COG package 20 uses a plurality of adhesive conductive films (ACF) 26 and a glass substrate 22. Typically, the COG package 20 is widely applied to a technology installing a DDI chip over the glass substrate 22 in a LCD, and according to the COG package 20, the DDI chip is installed over the glass substrate 22 including a LCD panel 25. Herein, reference numerals 23 and 24 denote a plurality of thin film copper interconnection lines and a plurality of bumps, respectively.

The typical COF package technology and the typical COG package technology make the thin film copper interconnection lines have minute line widths and fine spaces between them and thus, it is possible for the thin film copper interconnection lines to be miniaturized and maintain fine pitch. Also, since the installed chip and the thin film copper interconnection lines formed over the substrate are electrically connected by a bump bonding, compared to a wire bonding separately bonding chip pads and leads of a lead frame, the bump bonding can fulfill the bonding of the chip pads and the leads in a bundle.

Meanwhile, since an amount of the heat generated within the semiconductor chip is not sufficiently large in the typical COF package and the typical COG package, matters relating to the heat have not been greatly concerned. Therefore, a technology relating to low current consumption for optimizing the current consumed during driving the semiconductor chip in an application field has been mainly concerned.

However, as a DDI chip to drive a display panel includes a number of channels and gets bigger in a display such as a LCD, an amount of the heat generated within a unit chip is getting significantly increased. Accordingly, it also becomes an important matter how to manage the heat generated within the unit chip along with embodying the low current consumption. So far, the heat generated within the chip has been managed only by a natural air cooling method. As a result, in case that the heat generated within the chip gets out of the range which the natural air cooling method can manage, the temperature of a junction region within the chip gets more higher and thus, there are induced various problems in reliability of a chip operation.

SUMMARY OF THE INVENTION

It is, therefore, an object of the present invention to provide a semiconductor chip capable of improving reliability in driving a chip by effectively discharging the heat generated inside the semiconductor chip without causing damage in active devices, and a semiconductor chip package.

In accordance with one aspect of the present invention, there is provided a semiconductor device chip, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a plurality of second metal interconnection lines placed between the channel blocks, each of the second metal interconnection lines being connected to one of the substrate and a corresponding well region; and a plurality of first heat transfer bumps placed over the second metal interconnection lines to receive the heat generated during driving the channel blocks through the second metal interconnection lines and transfer the received heat to a plurality of second external interconnection lines to be connected to the external side.

In accordance with another aspect of the present invention, there is provided a semiconductor device chip, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a power supplying unit for receiving one of a power voltage and a ground voltage through a power input terminal from the external side to drive the channel blocks; a plurality of second metal interconnection lines respectively connected to one of the substrate and the well regions of the channel blocks; a plurality of heat transfer lines respectively connected to the second metal interconnection lines; a plurality of first connection lines corresponding to the heat transfer lines, wherein each of the first connection line has one side connected to one side of a corresponding heat transfer line and the other side connected to the power input terminal; a plurality of second connection lines corresponding to the heat transfer lines, wherein each of the second connection lines is connected to the other side of the corresponding heat transfer line; and a plurality of first heat transfer bumps respectively connected to the second connection lines to transfer the heat received from the substrate and the well regions through the second metal interconnection lines, the heat transfer lines and the second connection lines.

In accordance with further aspect of the present invention, there is provided a semiconductor device chip, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a plurality of second metal interconnection lines placed between the channel blocks, each of the second metal interconnection lines being connected to one of the substrate and a corresponding well region; and a plurality of first heat transfer bumps placed over the channel blocks, connected to the second metal interconnection lines, and transferring the heat received from one of the substrate and the well regions through a plurality of first external interconnection lines to be connected to the external side.

In accordance with still further aspect of the present invention, there is provided a semiconductor chip device, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a plurality of second metal interconnection lines placed between the channel blocks, each of the second metal interconnection lines being connected to one of the substrate and a corresponding well region; a plurality of first heat transfer bumps placed over the second metal interconnection lines to receive the heat generated during driving the channel blocks through the second metal interconnection lines and transfer the received heat to a plurality of second external interconnection lines to be connected to the external side; and a supporting substrate including the first external interconnection lines and the second external interconnection lines connected to the first heat transfer bumps.

In accordance with still further aspect of the present invention, there is provided a semiconductor device chip, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a power supplying unit for receiving one of a power voltage and a ground voltage through a power input terminal from the external side to drive the channel blocks; a plurality of second metal interconnection lines respectively connected to one of the substrate and the well regions of the channel blocks; a plurality of heat transfer lines respectively connected to the second metal interconnection lines; a plurality of first connection lines corresponding to the heat transfer lines, wherein each of the first connection line has one side connected to one side of a corresponding heat transfer line and the other side connected to the power input terminal; a plurality of second connection lines corresponding to the heat transfer lines, wherein each of the second connection lines is connected to the other side of the corresponding heat transfer line; a plurality of first heat transfer bumps respectively connected to the second connection lines to transfer the heat received from the substrate and the well regions to a plurality of second external interconnection lines through the second metal interconnection lines, the heat transfer lines and the second connection lines; and a supporting substrate including the first external interconnection lines and the second external interconnection lines respectively connected to the first heat transfer bumps.

In accordance with still further aspect of the present invention, there is provided a semiconductor device chip, including: a plurality of channel blocks each of which includes a plurality of channels, each of the channels including a plurality of unit devices placed in a substrate and a plurality of well regions arranged in the substrate; a plurality of first metal interconnection lines connected to the unit devices comprising the channels to receive and transfer data signals from and to the external side; a plurality of normal bumps for transferring the data signals received by the first metal interconnection lines through a plurality of first external interconnection lines to be connected to the external side; a power supplying unit for receiving one of a power voltage and a ground voltage through a power imputer terminal from the external side to drive the channel blocks; a plurality of second metal interconnection placed between the channel blocks, each of the second metal interconnection lines being connected to one of the substrate and the corresponding well region; a plurality of heat transfer bumps placed over the channel blocks and respectively connected to the second metal interconnection lines to transfer the heat transferred from the substrate and the well regions through the second metal interconnection lines; and a supporting substrate including the first external interconnection lines and the second external interconnection line connected to the first heat transfer bumps.

BRIEF DESCRIPTION OF THE DRAWINGS

The above and other objects and features of the present invention will become better understood with respect to the following description of the preferred embodiments given in conjunction with the accompanying drawings, in which:

FIGS. 7A to 7E are diagrams illustrating a semiconductor device chip package in accordance with a second embodiment of the present invention;

DETAILED DESCRIPTION OF THE INVENTION

Hereinafter, detailed descriptions on certain embodiments of the present invention will be provided with reference to the accompanying drawings.

Figure 1A:
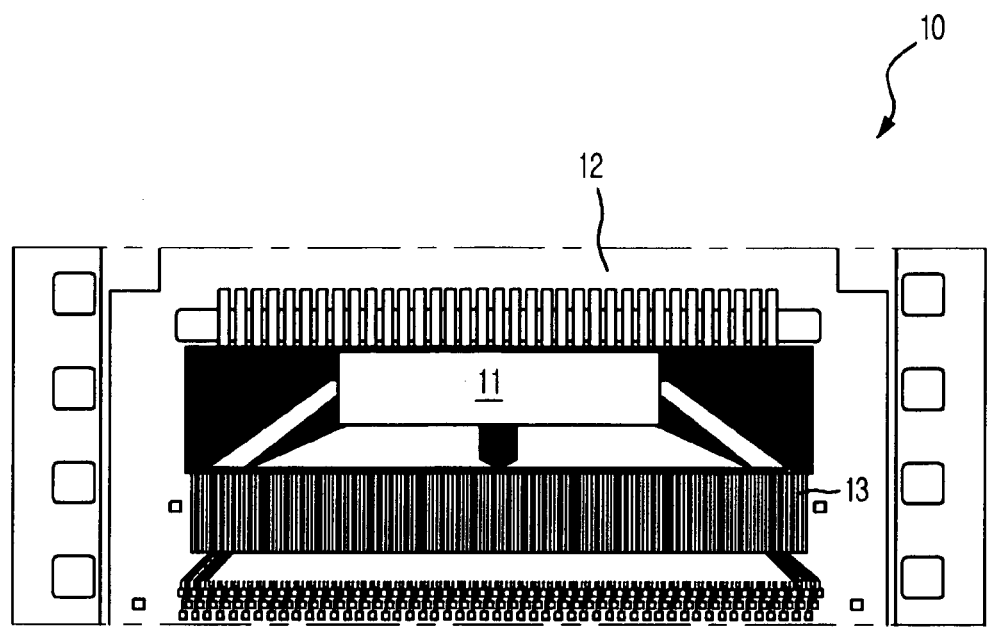
FIGS. 1A and 1B are top view and a cross-sectional view illustrating a semiconductor device chip package packaged through a typical chip on film (COF) technology, respectively.
Figure 1B:
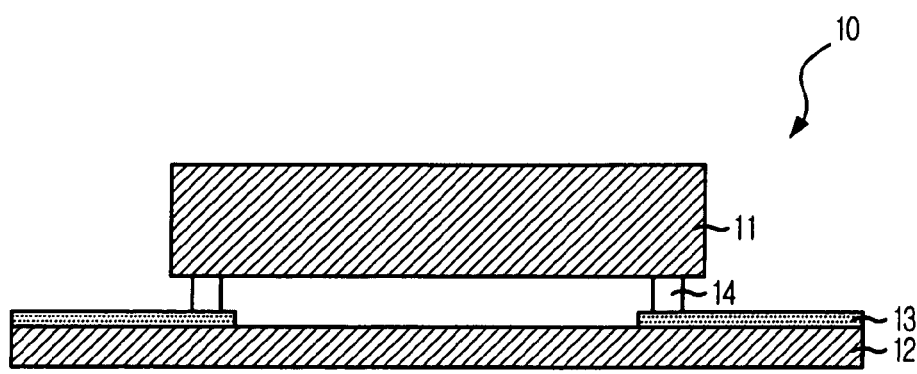
Figure 2A:
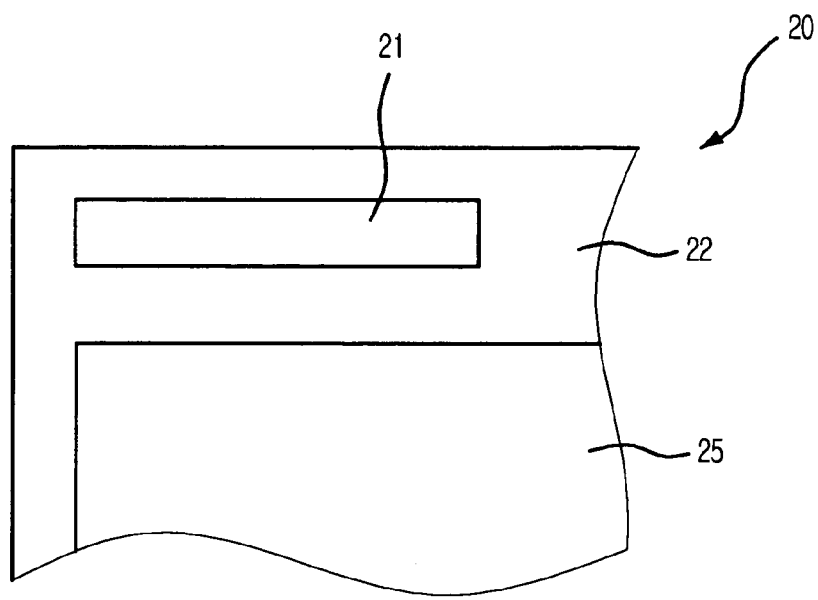
FIGS. 2A and 2B are top view and a cross-sectional view illustrating a semiconductor device chip package packaged through a typical chip on glass (COG) technology.
Figure 2B:
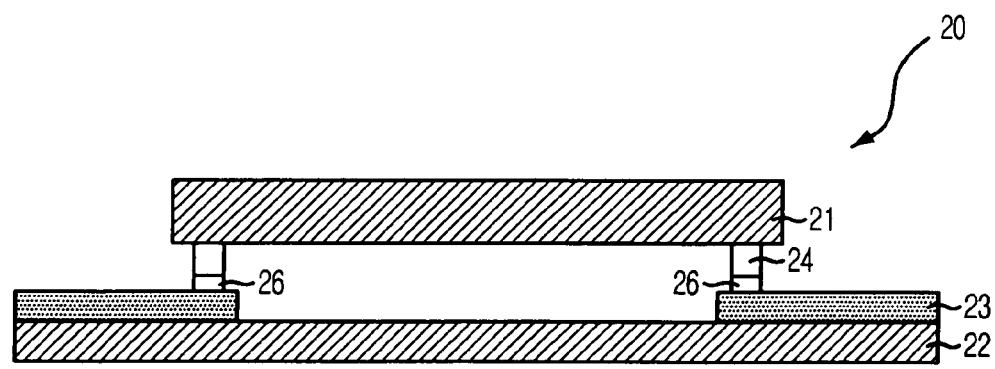
Figure 3:
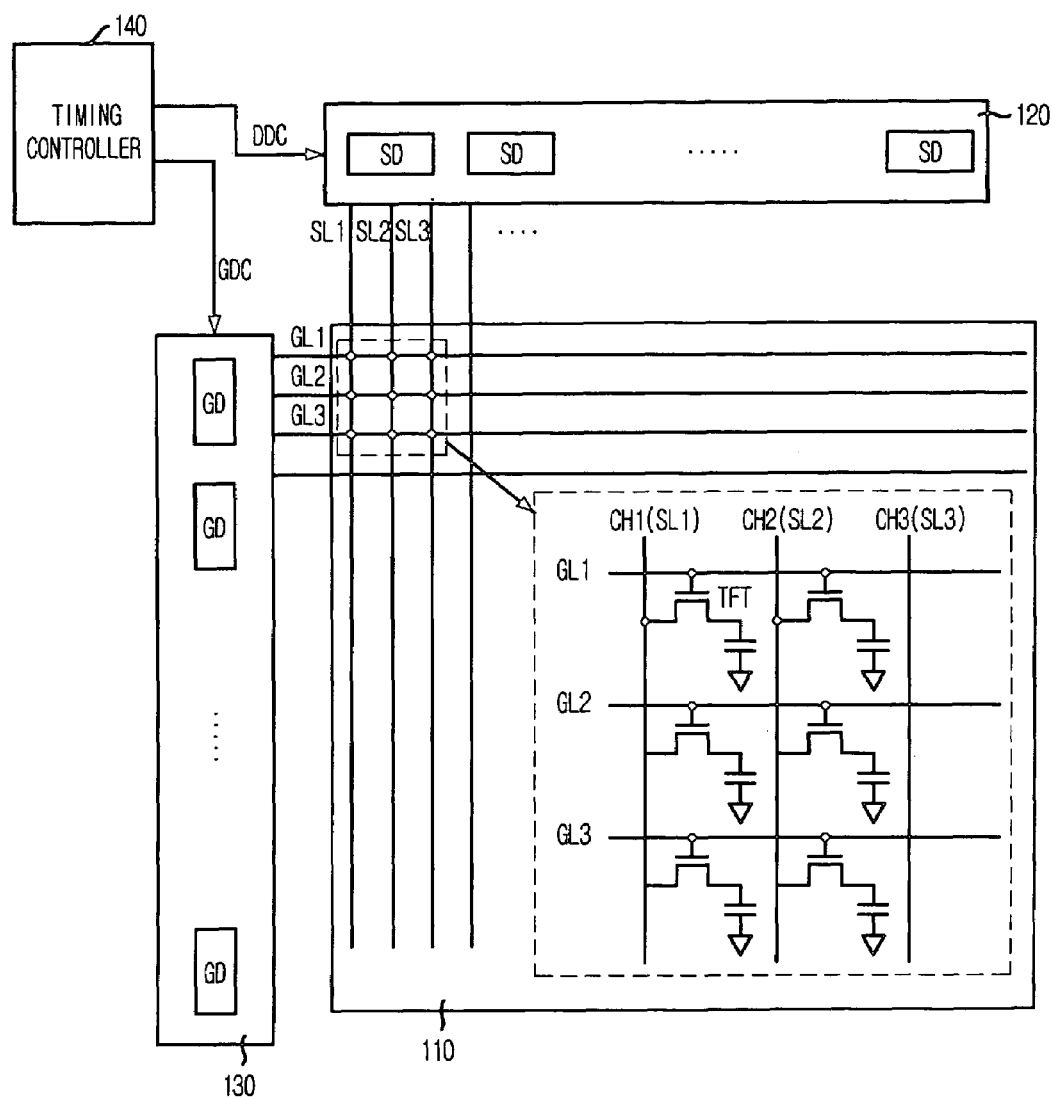
FIG. 3 is a block diagram illustrating a liquid crystal display (LCD)
Figure 4:
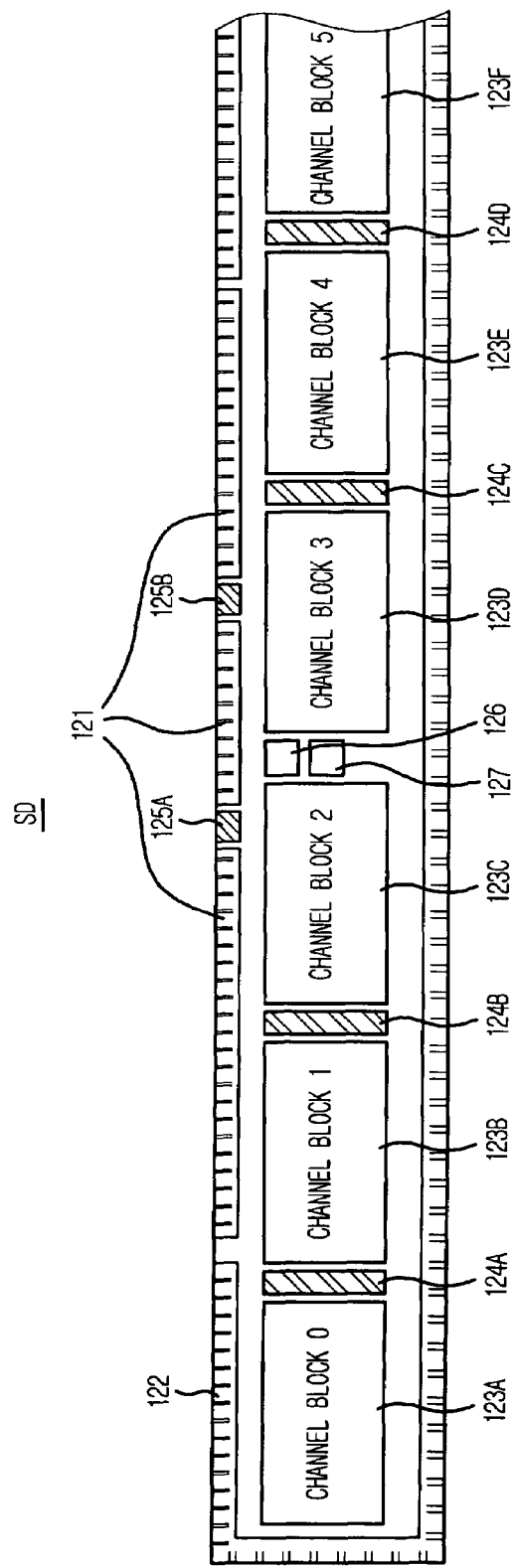
FIG. 4 is a top view illustrating a source driver integrated circuit (IC) chip shown in FIG. 3.
Figure 5:
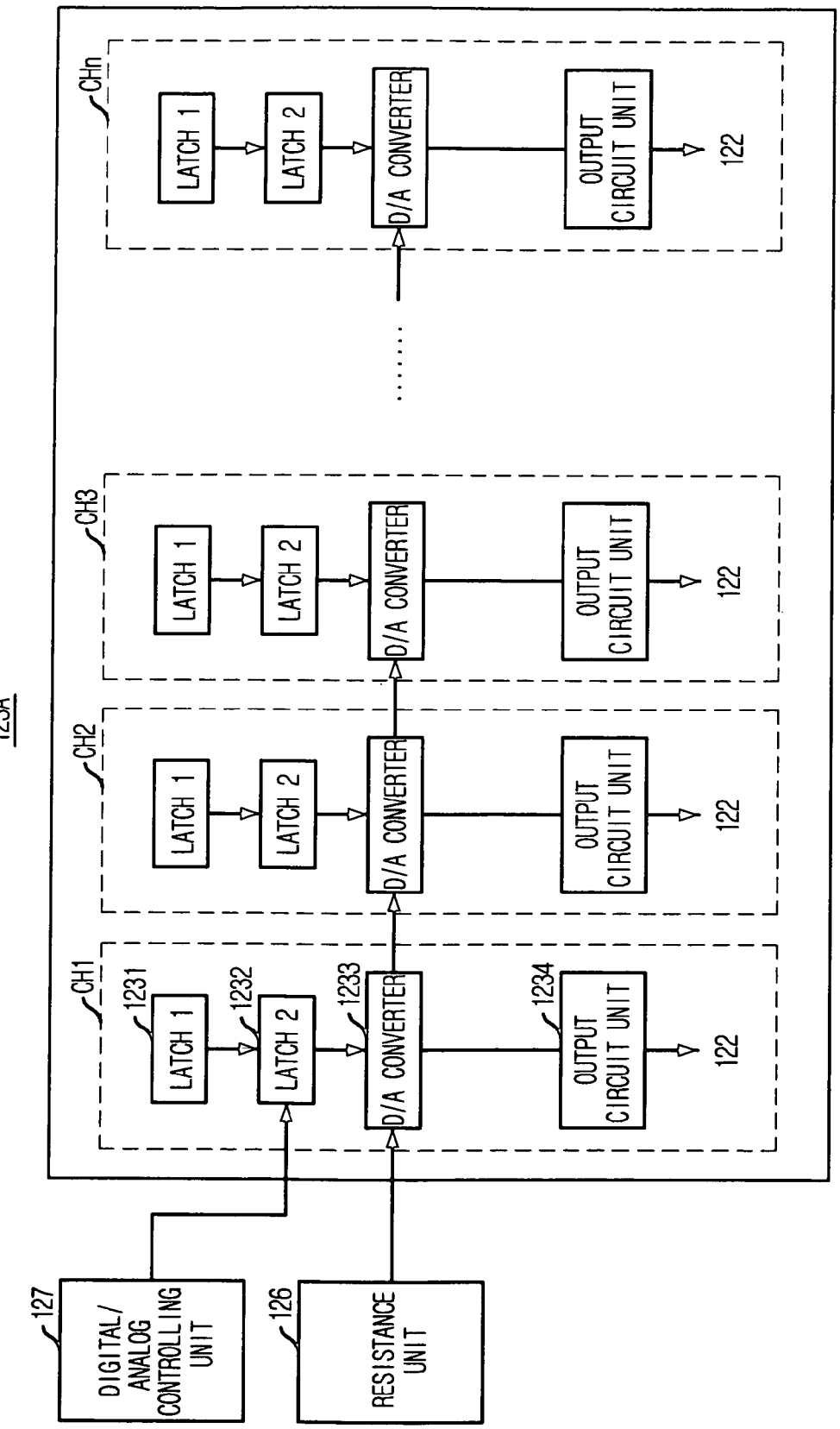
FIG. 5 is a block diagram illustrating a channel block shown in FIG. 4.

FIG. 3 is a block diagram illustrating a liquid crystal display (LCD). FIG. 4 is a top view illustrating an internal structure of a source driver integrated circuit (IC) chip shown in FIG. 3. FIG. 5 is a block diagram illustrating channel constitution of the source driver IC chip shown in FIG. 4.

As shown in FIG. 3, the LCD includes a LCD panel 110 comprised of pixel cells formed in an intersection between a plurality of source lines SL (or, a plurality of data lines) and a plurality of gate lines GL; a source driving circuit unit 120 and a gate driving circuit unit 130 connected to sub pixels of the pixels formed in the LCD panel 110, respectively and sequentially driving the sub pixels by a gate driving signal; and a timing controller 140 controlling the source driving circuit unit 120 and the gate driving circuit unit 130.

The source driving circuit unit 120 includes a plurality of source driver IC chips SD. Each of the source driver IC chips SD is closely examined in FIG. 4. A plurality of channel blocks 123A to 123F are placed in the center of the source driver IC chip SD, and a plurality of power supplying units 124A to 124D are placed between the channel blocks 123A to 123F. To surround the channel blocks 123A to 123F and the power supplying units 124A to 124D, a plurality of input terminals 121 and a plurality of output terminals 122 are placed in the edge of the source driver IC chip SD. A plurality of power input terminals 125A and 125B receiving a power from the external side and supplying the received power to the power supplying units 124A to 124D are placed between the input terminals 121. Meanwhile, a reference numeral 126 denotes a resistance unit, and a reference numeral 127 denotes a digital/analog (D/A) controlling unit.

As shown in FIG. 5, the channel blocks 123A to 123F include a plurality of channels CH1 to CHn. Each of the channels CH1 to CHn includes a first latch unit 1231; a second latch unit 1232; a D/A converter 1233 converting digital output signals of the second latch unit 1232 to analog signals according to a resistance value of the resistance unit 126; and an output circuit unit 1234 buffering the analog signals outputted from the D/A converter 1233 in the identical value and outputting the buffered analog signals to the output terminals 122.

As described above, the channel blocks 123A to 123F formed with active devices are placed in the center of the source driver IC chip SD. Accordingly, during driving the source driver IC chip SD, the largest amount of heat is generated from the center of the source driver IC chip SD.

Hereinafter, a plurality of specific embodiments in accordance with the present invention will be explained based on the above described source driver IC chip.

FIGS. 6A to 6E are diagrams illustrating a semiconductor chip package in accordance with a first embodiment of the present invention.

Figure 6A:
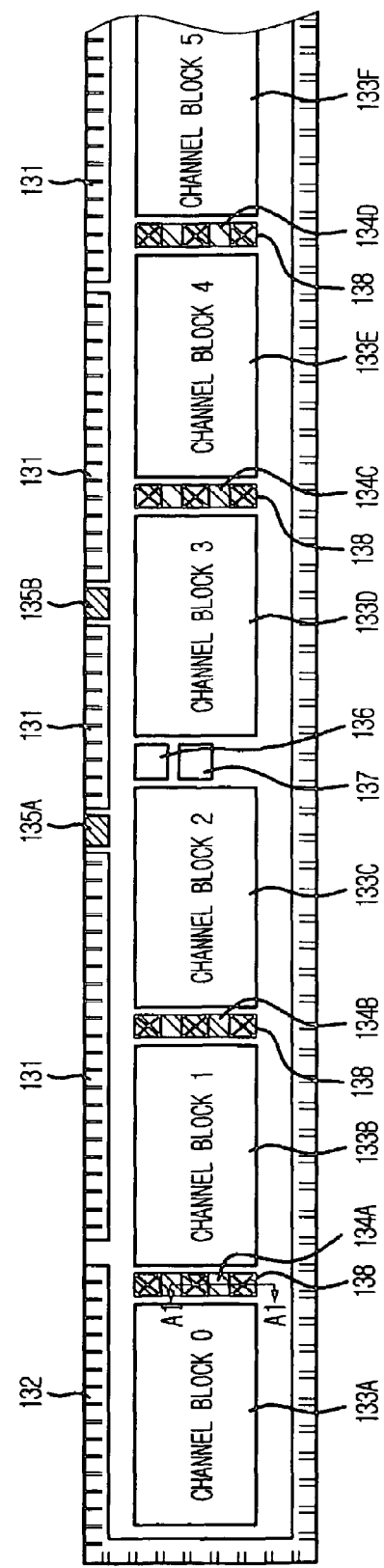
FIGS. 6A to 6E are diagrams illustrating a semiconductor device chip package in accordance with a first embodiment of the present invention.
Figure 6B:
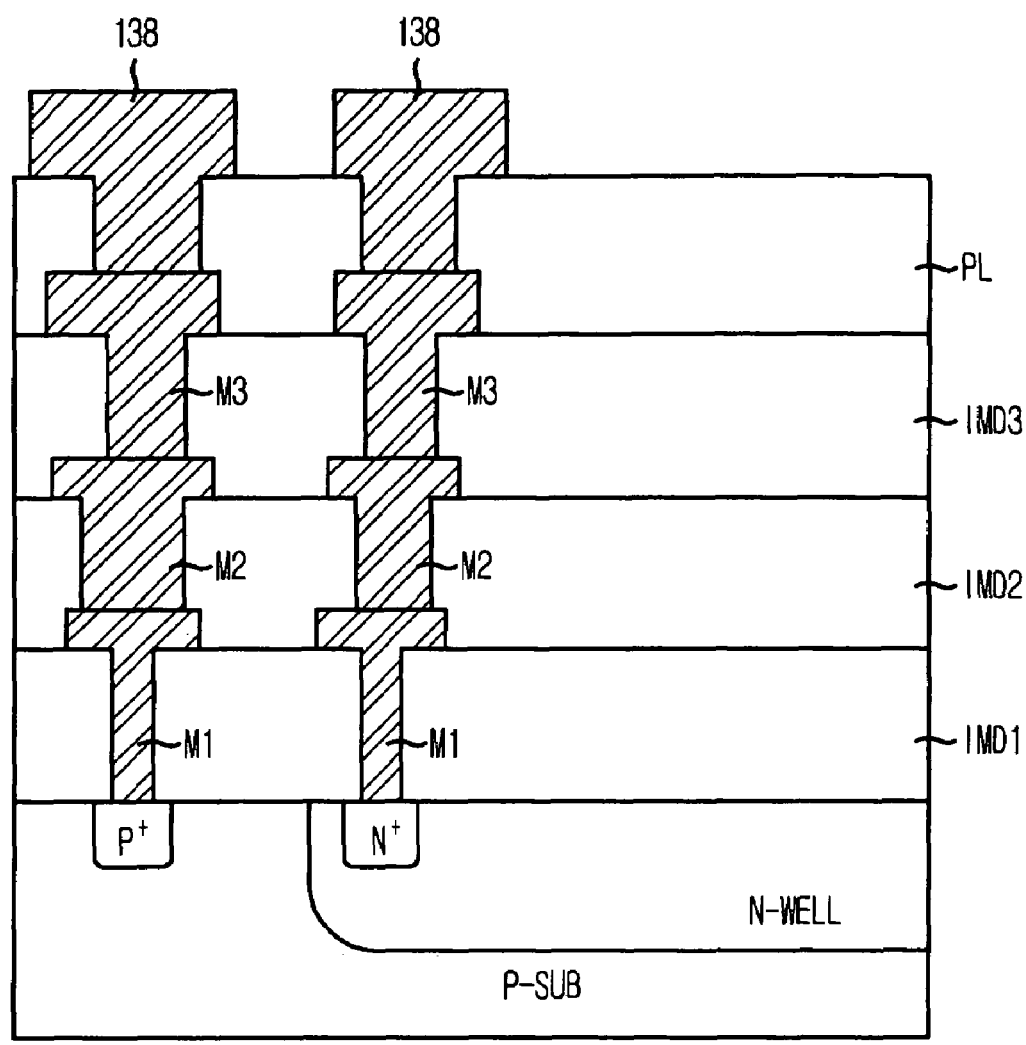
Figure 6C:
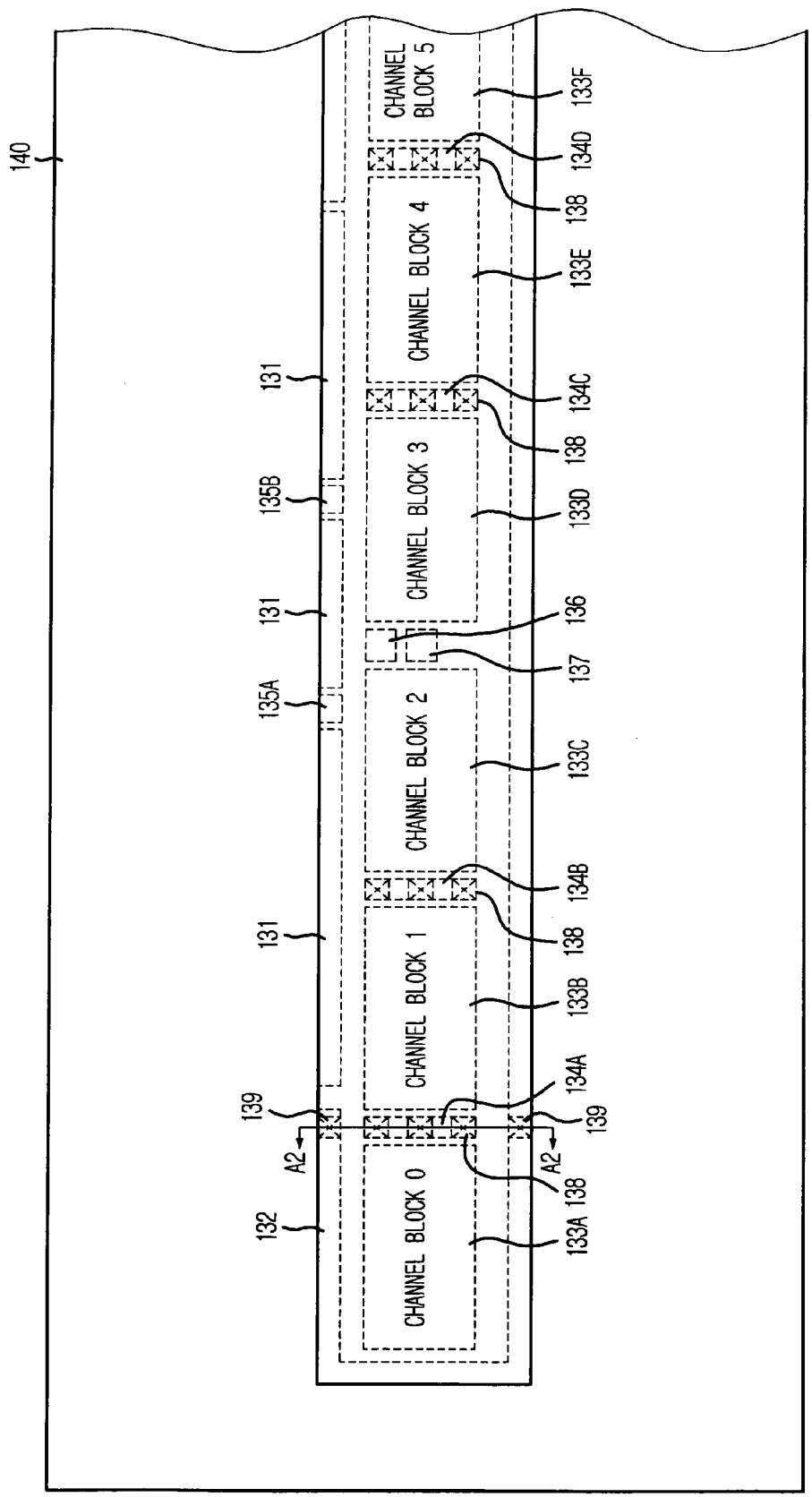
Figure 6D:
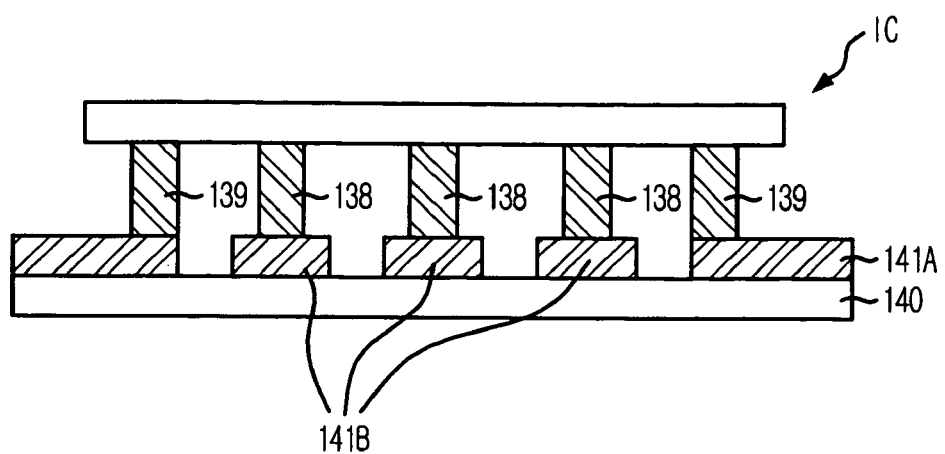
Figure 6E:
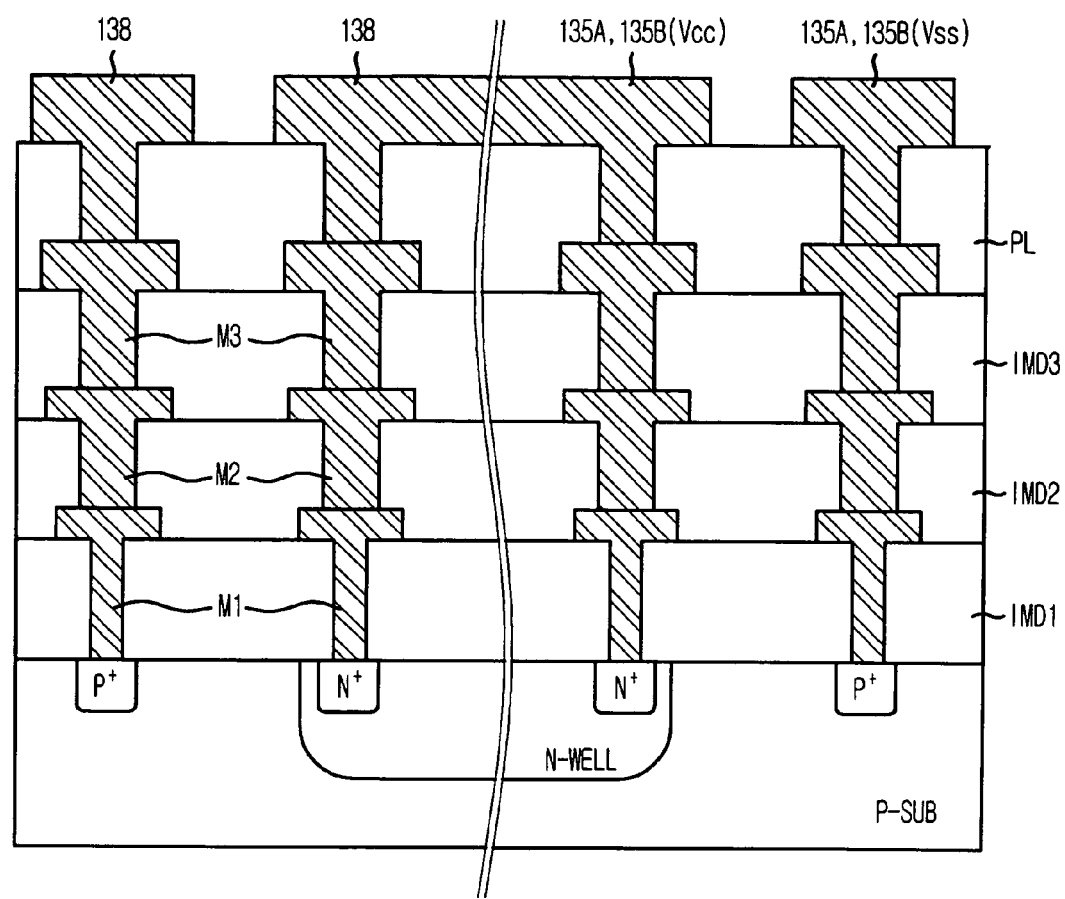

FIG. 6A is a top view illustrating a source driver IC chip. FIG. 6B is a cross-sectional view illustrating FIG. 6A cut along a line A1-A1. FIG. 6C is a top view illustrating that the source driver IC chip shown in FIG. 6A is formed over a film substrate through a chip on film (COF) technology. FIG. 6D is a cross-sectional view illustrating FIG. 6C cut along a line A2-A2. FIG. 6E is a cross-sectional view illustrating the bonding status between power input terminals and bumps, and a P-type substrate or an N-type well region.

As shown in FIG. 6A, the semiconductor chip package in accordance with the first embodiment of the present invention includes a plurality of bumps 138 installed in regions where a plurality of power supplying units 134A to 134D of the source driver IC chip are formed (hereinafter, referred to as power supplying unit regions). As shown in FIG. 6D, the bumps 138 are connected to a plurality of second conductive interconnection lines 141B formed over a film substrate 140. The second conductive interconnection lines 141B connected to the bumps 138 are electrically isolated from a plurality of first conductive interconnection lines 141A connected to a plurality of bumps 139 (refer to FIG. 6C) connected to a plurality of input/output terminals 131 and 132. For instance, the first and the second conductive interconnection lines 141A and 141B can be formed with a thin film copper. The bumps 138 are formed of a conductive material such as gold (Au). In addition to gold (Au), the bumps 138 can be formed of a material having a high heat discharging rate to efficiently emit the heat.

The reason why the bumps 138 are installed in the power supplying unit regions is because the active devices are not formed in the power supplying units 134A to 134D. However, it may be possible to form a plurality of bumps over the active devices if there is not a problem in reliability of the IC chip. The bumps formed over the channel blocks 133A to 133F are connected to the conductive interconnection lines formed over the film substrate 140 and thus, emits the heat generated within the active devices to the external side through the conductive interconnection lines.

The power supplying units 134A to 134D serve a role in receiving a power voltage Vcc and a ground voltage Vss from a plurality of power input terminals 135A and 135B, and supplying the received power voltage Vcc and the received ground voltage Vss to the P-type substrate and the N-type well region. Accordingly, the power supplying units 134A to 134D includes a plurality of metal layers or metal interconnection lines to transfer the power voltage Vcc and the ground voltage Vss instead of the active devices. As shown in FIG. 6D, in case of applying the COF technology forming the source driver IC chip over the film substrate 140 through compression, a device property is not affected at all.

For reference, a packaging process using the COF technology will be examined hereinafter. A driver IC chip is put over an upper portion of a film substrate. Then, a pressure is applied on an upper portion of the driver IC chip and a lower portion of the film substrate upward and downward, respectively and thus, bumps installed beneath the driver IC chip are connected to conductive interconnection lines formed over the film substrate.

Accordingly, in case of installing the bumps 138 in regions where a plurality of channel blocks 133A to 133F are formed (hereinafter, referred to as channel block regions), the active devices of the channel blocks 133A to 133F are damaged by the pressure applied during the packaging process using the COF technology and thus, an operation property of the device can be degraded. To prevent this limitation, the bumps 138 are installed in the power supplying unit regions where the active devices are not formed in accordance with the first embodiment of the present invention.

As shown in FIG. 6B, the bumps 138 are connected to the P-type substrate and the N-type well region through the metal layers M1 to M3 because the active devices of the channel blocks 133A to 133F are formed in the identical P-type substrate and the identical N-type well region. That is, the heat generated from the active devices forming the channel blocks 133A to 133F is transferred through the P-type substrate and the N-type well region. The heat transferred to the P-type substrate or the N-type well region is emitted to the bumps 138 through the metal layers M1 to M3. The bumps 138 are connected to the metal layer M3 after etching a passivation layer PL which is an insulation layer. Herein, reference denotations IMD1 to IMD3 denote first to third inter-metal dielectric layers.

As shown in FIG. 6C, a driver IC chip of which the bumps 138 are installed in the power supplying unit regions is formed over the film substrate 140 trough the packaging process using the COF technology. At this time, the second conductive interconnection lines 141B (refer to FIG. 6D) connected to the bumps 138 formed in the power supplying unit regions other than predetermined typically installed bumps including the bumps 139 (For the sake of explanation, only two bumps 139 are illustrated herein.) formed in regions where the input/output terminals 131 and 132 are formed (hereinafter, referred to as input/output terminal regions) during the packaging process are formed over the film substrate 40. As shown in FIG. 6D, each of the bumps 138 installed in the power supplying unit regions are connected to the corresponding second conductive interconnection lines 141B, respectively and the typically installed bumps (not shown) including the bumps 139 formed in the input/output terminal regions are connected to the first conductive interconnection lines 141A. Accordingly, the internal heat of the driver IC chip transferred through the bumps 138 is emitted to the external side through the second conductive interconnection lines 141B.

As shown in FIG. 6B, in case of connecting the bumps 138 to the P-type substrate and the N-type well region through the metal layers M1 to M3, a ground voltage Vss and a power voltage Vcc supplied to the P-type substrate and the N-type well region through the power supplying units 134A to 134D may be emitted to the bumps 138, thereby causing loss. To prevent this limitation, in accordance with the first embodiment of the present invention, as shown in FIG. 6E, a plurality power input terminals 135A and 135B need to be connected to the bumps 138 through bumps of the power input terminals 135A and 135B or a separate metal layer. As a result, a path between the power supplying units 135A and 135B, and the P-type substrate and the N-type well region, and another path between the bumps 138, and the P-type substrate and the N-type well region are connected in parallel.

FIGS. 7A to 7E are diagram illustrating a semiconductor device chip package in accordance with a second embodiment of the present invention.

Figure 7A:
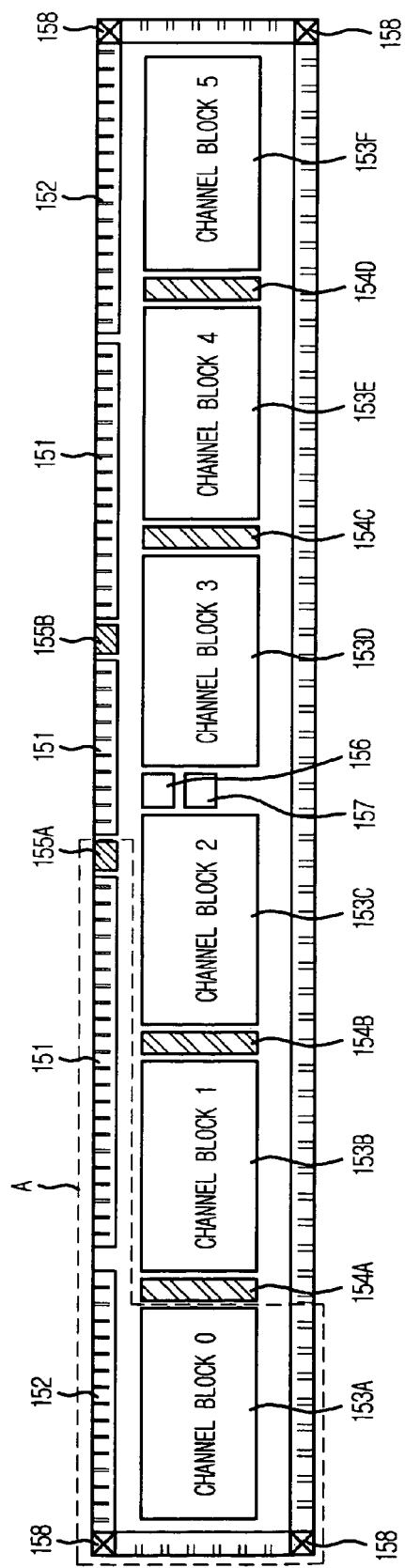
Figure 7C:
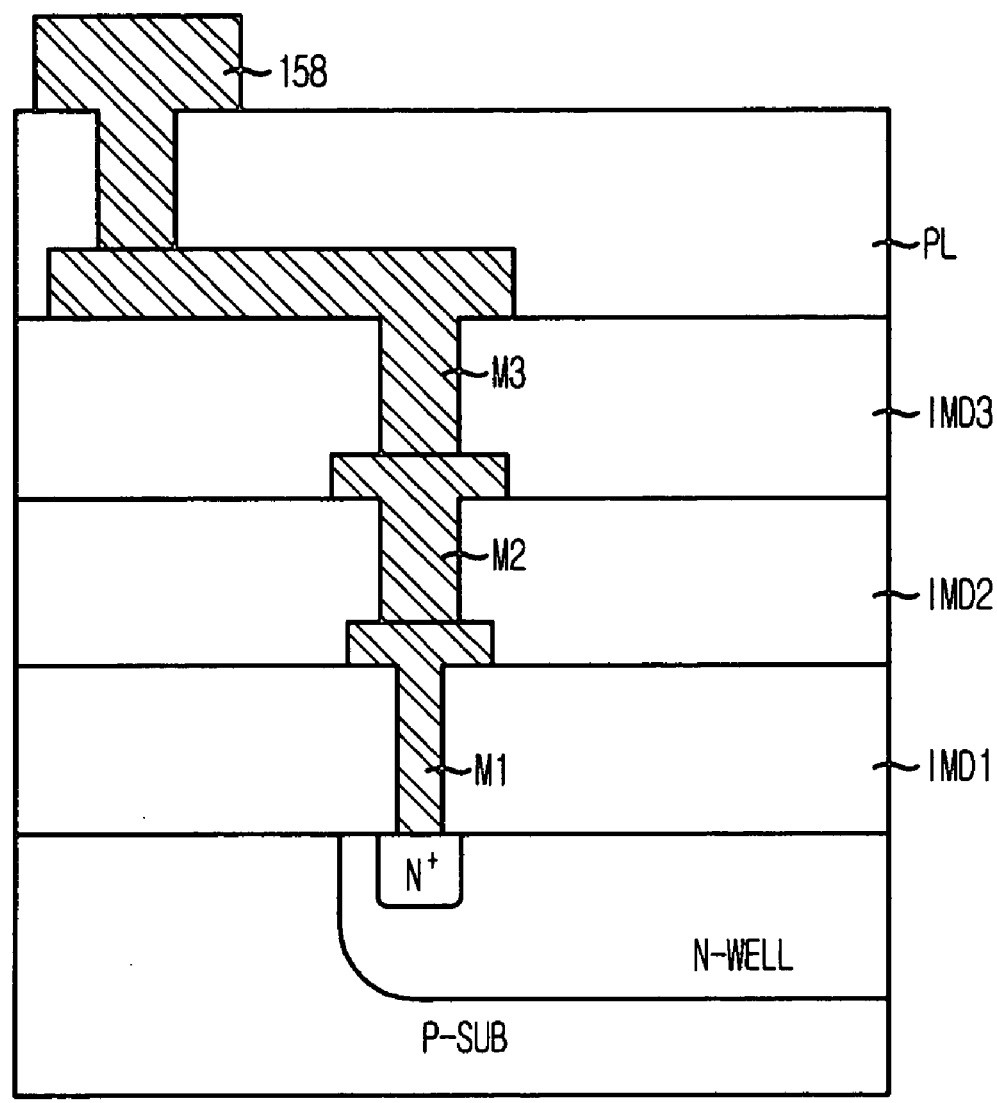
Figure 7D:
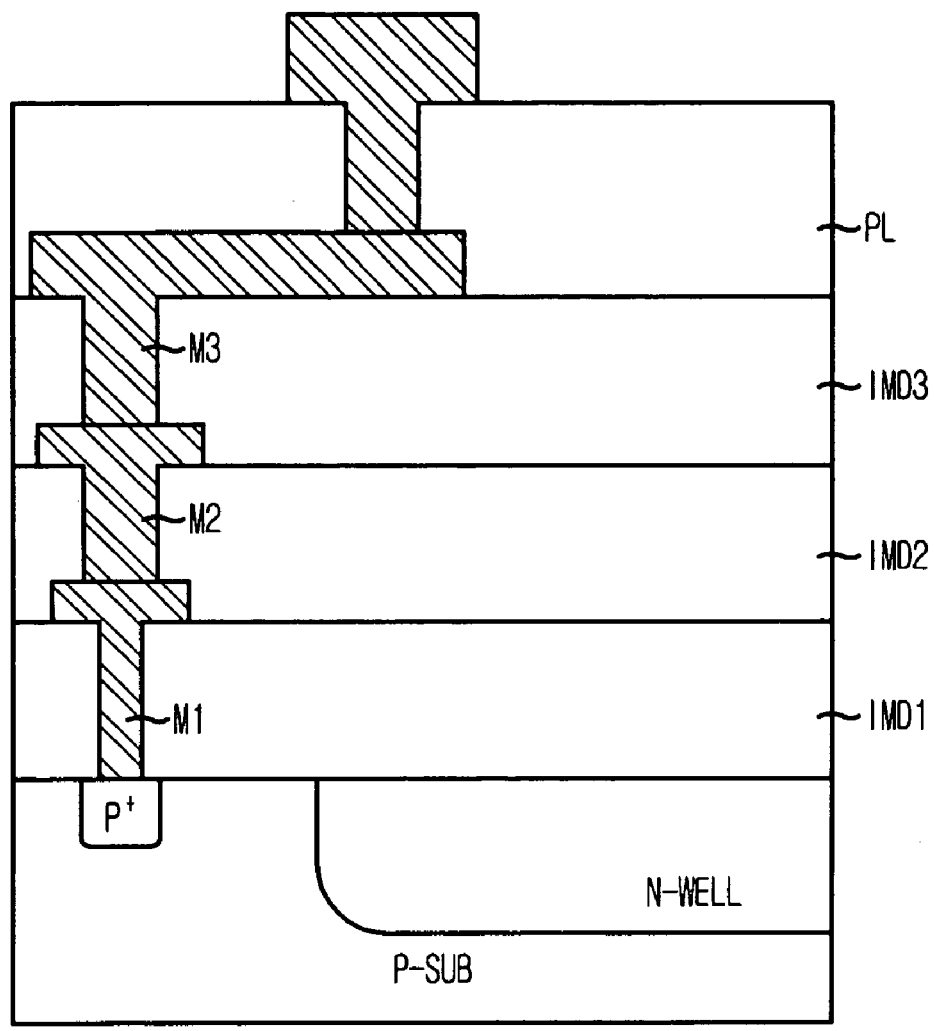
Figure 7E:
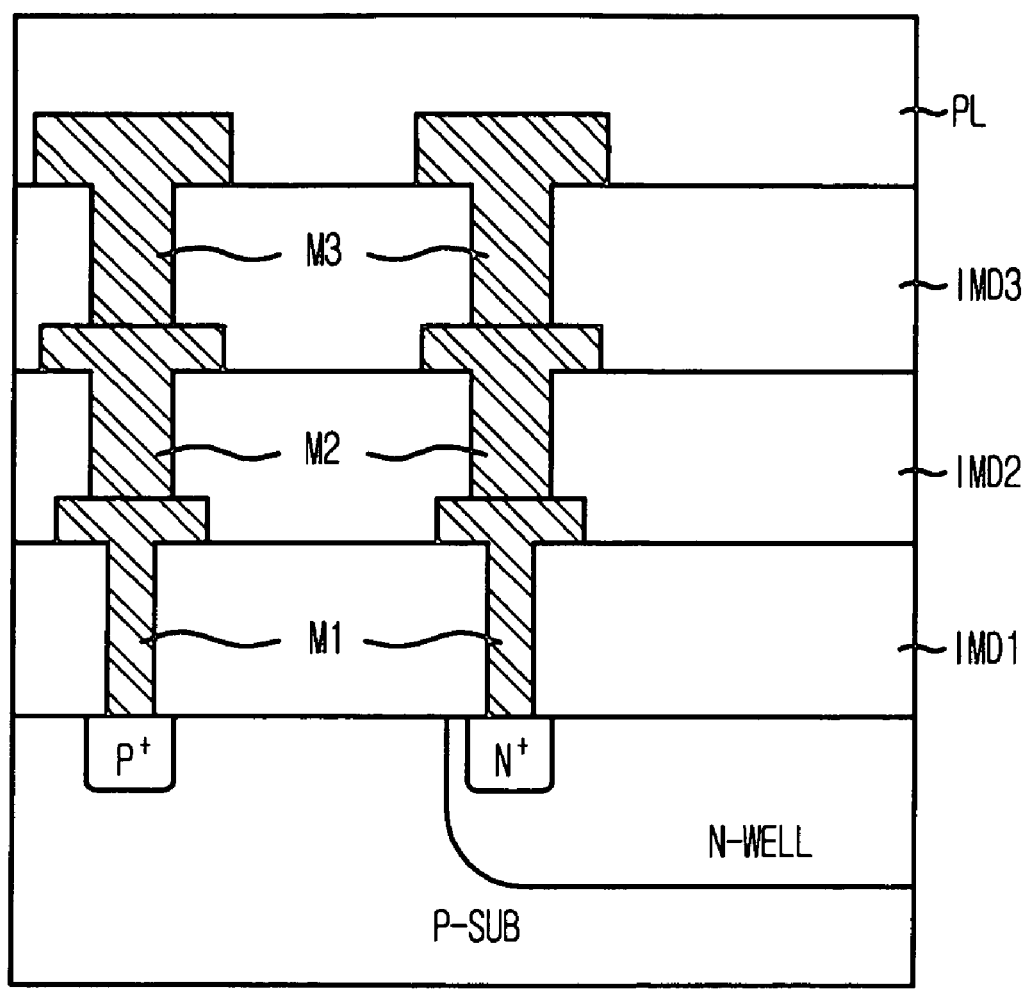

FIG. 7A is a top view illustrating a source driver IC chip. FIG. 7B is an enlarged top view illustrating a portion A shown in FIG. 7A. FIG. 7C is a cross-sectional view illustrating FIG. 7B cut along a line A1-A1. FIG. 7D is a cross-sectional view illustrating FIG. 7B cut along a line A2-A2. FIG. 7E is a cross-sectional view illustrating FIG. 7B cut along a line A3-A3.

As shown in FIG. 7A, the semiconductor device chip package in accordance with the second embodiment of the present invention includes bumps 158 installed each edge of the driver IC chip one by one when compared with the semiconductor device chip package in accordance with the first embodiment of the present invention including the bumps installed in regions where a plurality of power supplying units 154A to 154D are formed (hereinafter, referred to as power supplying unit regions). As shown in FIG. 7B, in regions where a plurality of channel blocks 153A to 153F are formed (hereinafter, referred to as channel block regions), a plurality of final metal layers or additional metal layers (or, metal interconnection lines) 159 (hereinafter, referred to as heat transfer lines) are formed in a one side opened square type, i.e., a '⊏' type. The heat transfer lines 159 are connected to the bumps 158. Meanwhile, the bumps 158 can be installed not only at the edges of the driver IC chip but also in regions where a plurality of input/output terminals 151 and 152 (hereinafter, referred to as input/output terminal regions) are formed with the appropriate number. However, the number of bumps 158 installed at the edges of the driver IC chip is not limited.

As shown in FIG. 7C to 7E, the heat transfer lines 159 are formed by appropriately etching a final metal layer M3 connected to a P-type substrate and a N-type well region through metal layers M1 and M2. In addition, an inter-metal dielectric layer is formed over an upper portion of the metal layer M3 and thus, a metal interconnection line can be separately formed. The heat transfer lines 159 need to be formed with the metal layer M3 connected to the P-type substrate and the N-type well region, or the metal interconnection line connected to the P-type substrate and the N-type well region to smoothly transfer the heat. Furthermore, predetermined portions of the heat transfer lines 159 are connected to a power input terminal 155A. In accordance with the second embodiment of the present invention, there are two heat transfer lines 159 electrically separated from each other in each of the channel blocks 153A to 153F. One of the heat transfer lines 159 is connected to the metal layer M3 connected to the P-type substrate and a ground voltage input terminal 1551A receiving a ground voltage (Vss). The other one is connected to the metal layer M3 connected to the N-type well region and a power voltage input terminal 1552A receiving a power voltage (Vcc).

Figure 8A:
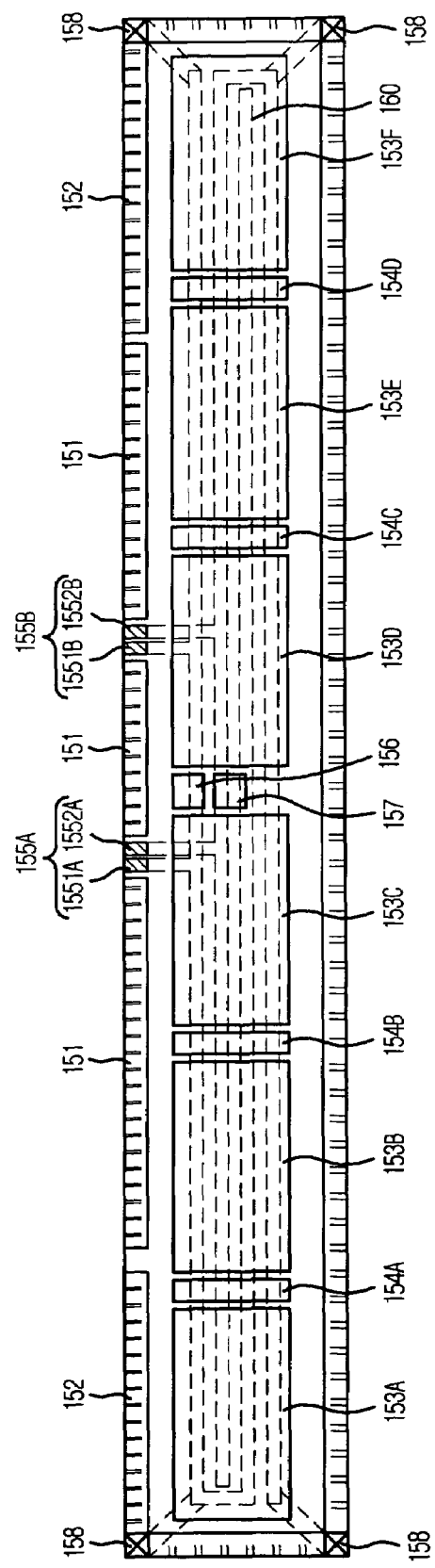
FIGS. 8A to 8C are diagrams illustrating a modified embodiment of the present invention.
Figure 8B:
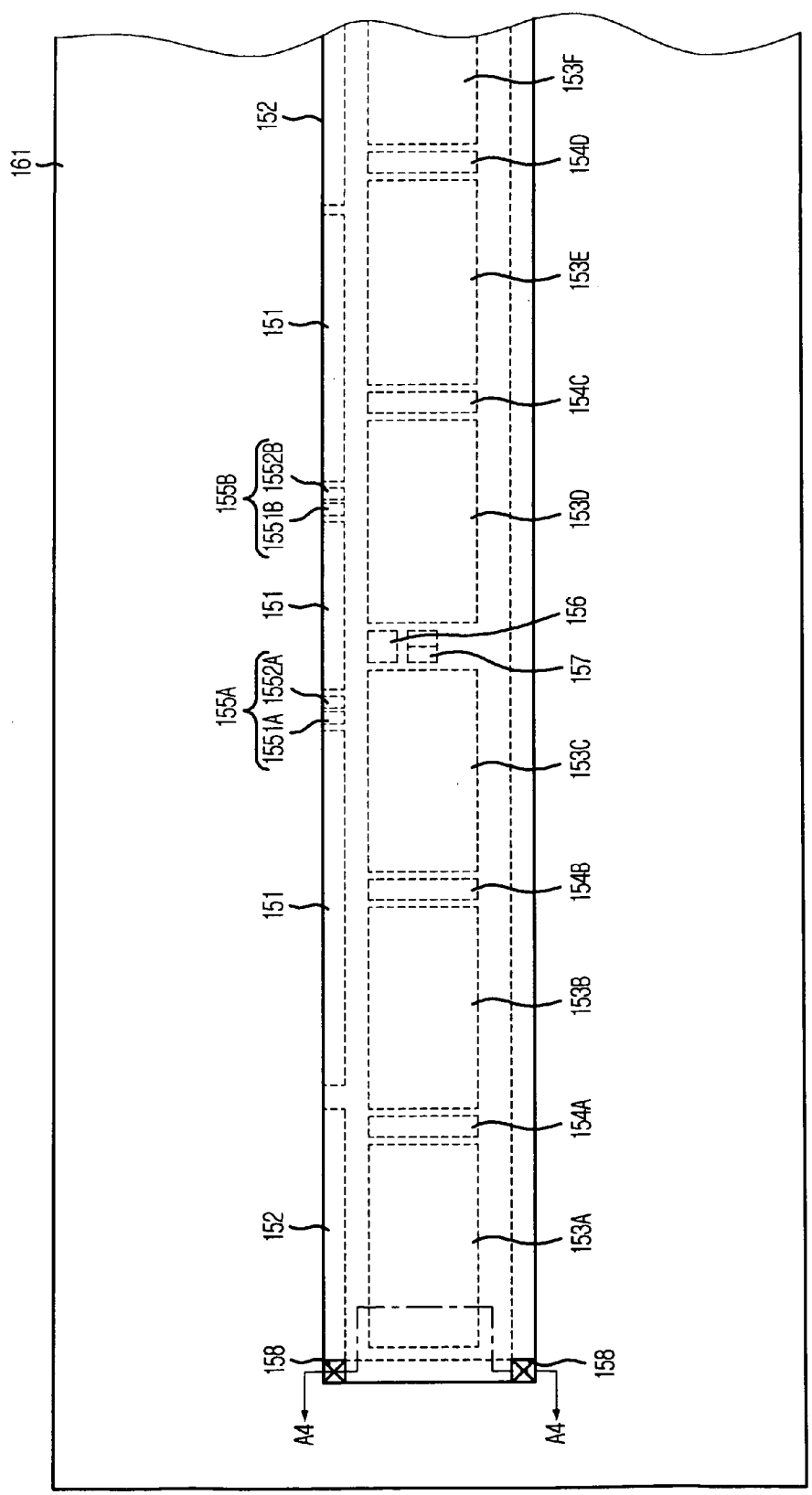
Figure 8C:
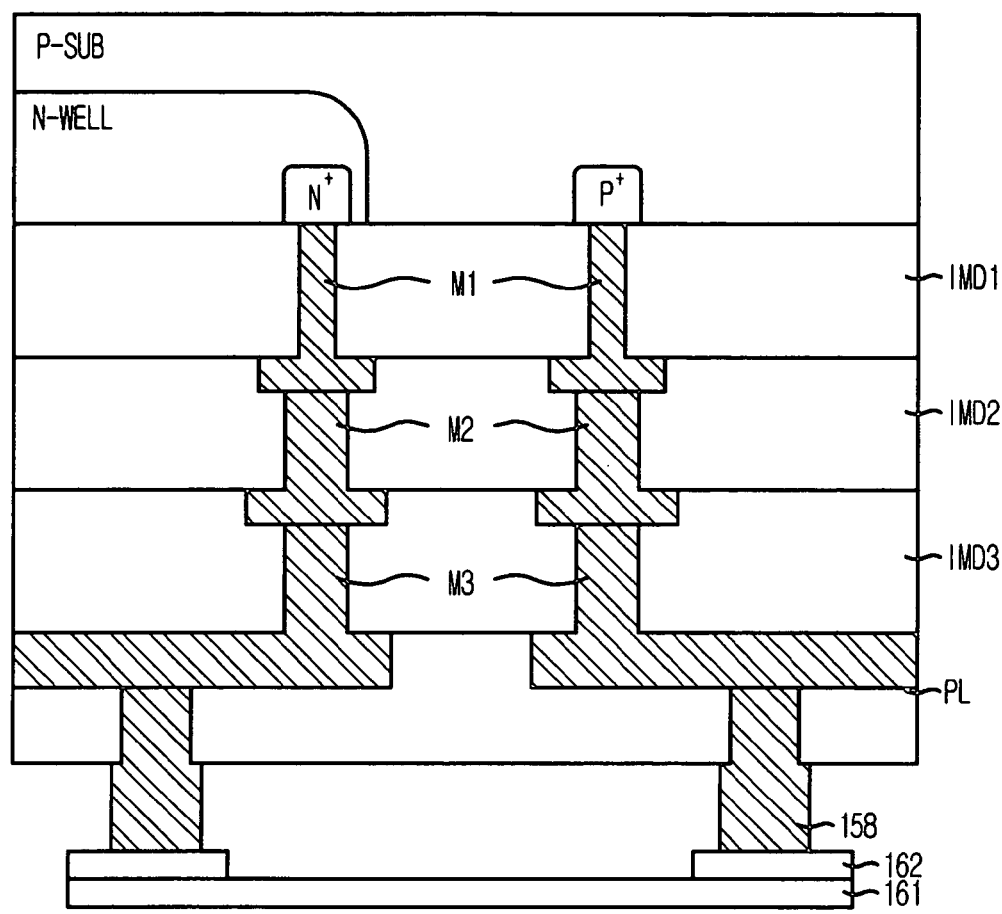

FIGS. 8A to 8C are diagrams illustrating a modified embodiment of the second embodiment of the present invention. FIG. 8A is a diagram illustrating a source driver IC chip. FIG. 8B illustrates the magnified driver IC chip shown in FIG. 8A, and FIG. 8C is a diagram illustrating FIG. 8B cut along a line A4-A4. Herein, the same reference numerals shown in FIGS. 7A to 7E denote similar elements through FIGS. 8A to 8C.

Referring to FIG. 8A, a heat transfer line 160 connected to each other throughout the whole driver IC chip when compared with the heat transfer lines 150 independently isolated from each other for every channel blocks 153A to 153F as shown in FIG. 7B.

As shown in FIG. 8B, the driver IC chip of which the bumps 158 are installed at the edges of the driver IC chip is put over an upper portion of a film substrate 161 through a packaging process using a COF technology. At this time, a plurality of conductive interconnection lines 162 (refer to FIG. 8C) connected to the bumps installed at the edges of the driver IC chip other than predetermined typically installed bumps including bumps (not shown) installed in regions where a plurality of input/output terminals 151 and 152 are formed (hereinafter, referred to as input/output terminal regions) during the packaging process are formed over the film substrate 161. For instance, the conductive interconnection lines 162 can be formed with a thin film copper.

As shown in FIG. 8C, each of the bumps 158 are connected to the corresponding conductive interconnection lines 162 respectively, and the typical bumps including the bumps formed in the input/output terminals regions are connected to typical conductive interconnection lines (not shown). Accordingly, the heat inside the driver IC chip is transferred to the bumps 158 through the metal layers M1 to M3, and the heat transferred to the bumps 158 is emitted into the outside through the conductive interconnection lines 162.

Meanwhile, the semiconductor chip package in accordance with the second embodiment of the present invention can be applied to a packaging process using a TCP technology. Typically, the TCP technology uses substrates isolated from each other, and the isolated substrate is sealed through a molding process. Accordingly, since there is not a supporting means to support the bumps 138 installed in the center, i.e., the power supplying unit regions (refer to FIG. 6A), the TCP technology cannot be used to fabricate the semiconductor chip package in accordance with the first embodiment of the present invention. However, since the bumps 158 (refer to FIG. 7A) are installed at the edges of the driver IC chip, the TCP technology can be used although there is not a separate supporting means in the center of the film substrate to fabricate the semiconductor chip package in accordance with the second embodiment of the present invention.

Figure 9A:
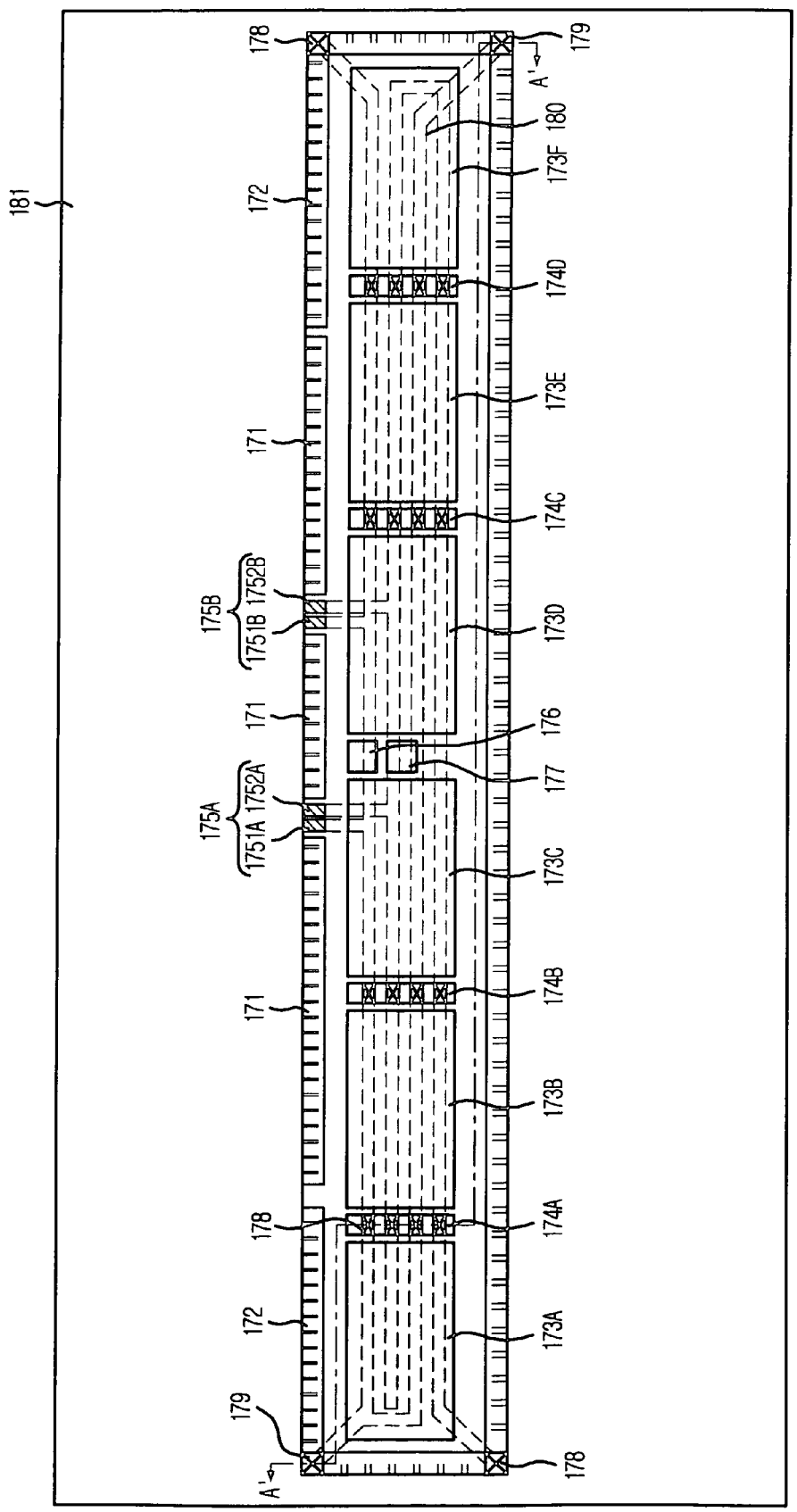
FIGS. 9A and 9B are diagrams illustrating a semiconductor device chip package in accordance with a third embodiment of the present invention.
Figure 9B:
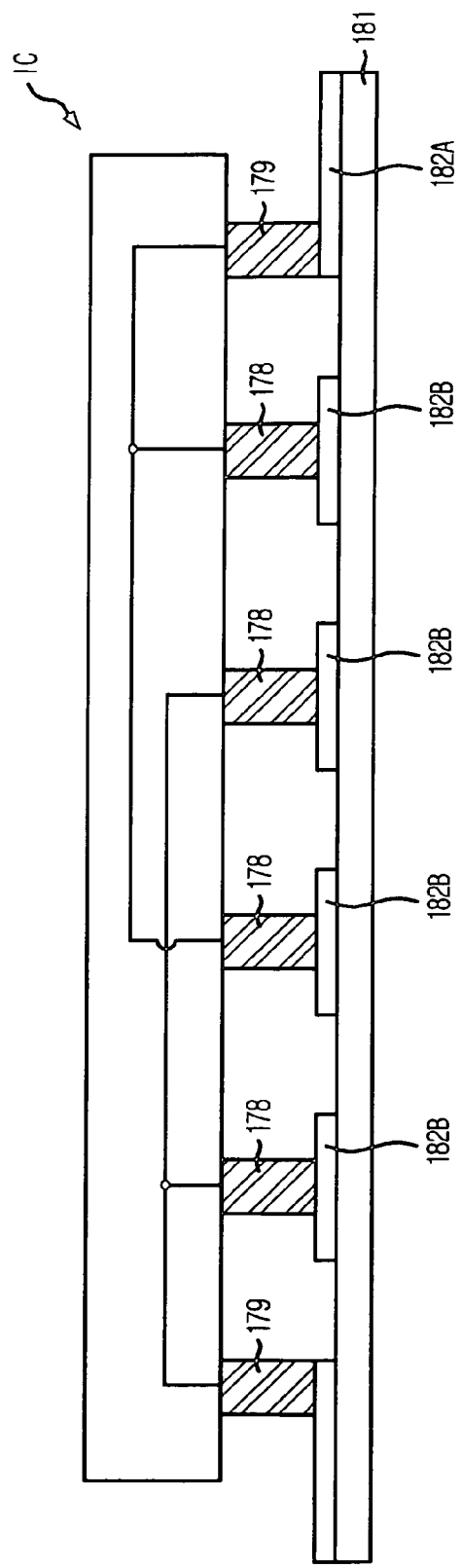

FIG. 9A is a top view illustrating a semiconductor device chip in accordance with a third embodiment of the present invention. FIG. 9B is a cross-sectional view illustrating FIG. 8A cut along a line A-A.

As shown in FIG. 9A, the semiconductor device chip package in accordance with the third embodiment of the present invention can be embodied by combining the first embodiment and the second embodiment. A plurality of bumps 178 are installed in regions where a plurality of power supplying units 174A to 174D are formed (hereinafter, referred to as power supplying unit regions), and a plurality of bumps 179 are installed at edges of a driver IC chip. The bumps 179 are connected to a heat transfer line 180 extending throughout regions where the channel blocks 173A to 173F are formed (hereinafter, referred to as channel block regions) as shown in the second embodiment of the present invention. Predetermined sides of the heat transfer line 180 are connected to a plurality of ground voltage input terminals 1751A and 1751B, and a plurality of a power voltage input terminals 1752A and 1752B of a plurality of power input terminals 175A and 175B.

As shown in FIG. 9B, the driver IC chip beneath which the bumps 178 and 179 are installed is formed over an upper portion of a film substrate 181 through a packaging process using a COF technology. At this time, a plurality of conductive interconnection lines 182A and 182B connected to the bumps 178 installed in regions where a plurality of power supplying units 174A to 174D are formed (hereinafter, referred to power supplying unit regions) other than predetermined typically installed bumps including bumps (not shown) installed in region where a plurality of input/output terminals 171 and 172 (hereinafter, referred to as input/output terminals regions), and the bumps 179 installed at the edges during the packaging process are formed over the film substrate 181. For instance, the conductive interconnection lines 182A and 182B can be formed with a thin film copper. Each of the bumps 178 and 179 are connected to the corresponding conductive interconnection lines 182A and 182B, and the typically installed bumps including the bumps formed in the input/output terminals regions are connected to typical interconnection lines (not shown). Accordingly, the internal heat inside the driver IC chip is transferred to the bumps 178 and 179 through a plurality of metal layers M1 to M3, and the heat transferred to the bumps 178 and 179 is emitted to the outside through the conductive interconnection lines 182A and 182B. That is, the heat is emitted through not only the bumps 178 but also the bumps 179 and as a result, heat emitting efficiency can be increased by an amount of the emitted heat through the bumps 179.

Figure 10:
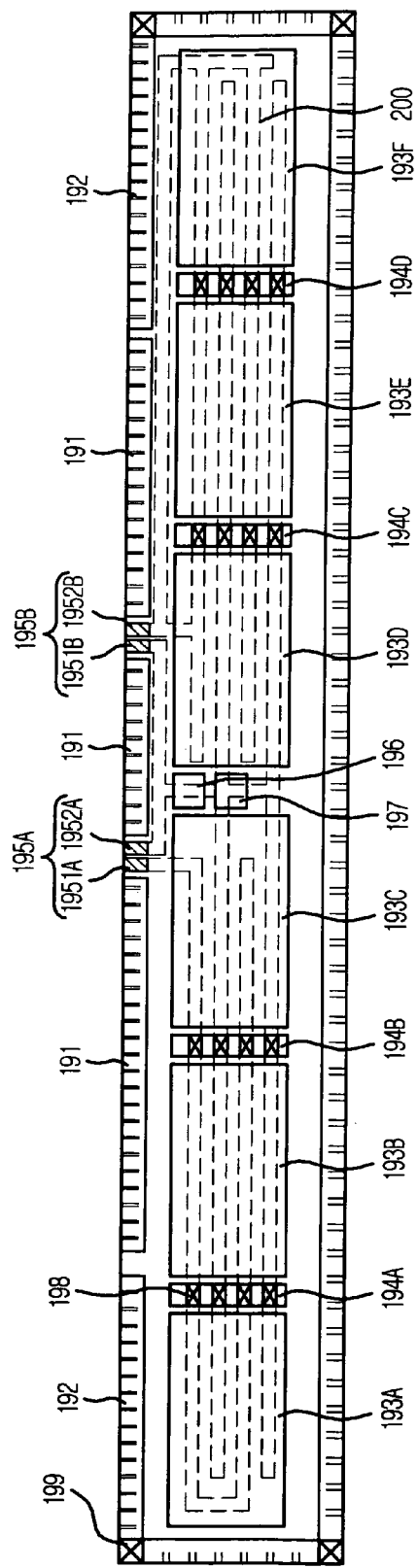
FIG. 10 is a diagram illustrating a modified embodiment of the third embodiment of the present invention.

FIG. 10 illustrates a modified embodiment of the third embodiment of the preset invention.

In accordance with the modified embodiment of the third embodiment, a heat transfer line 200 is formed symmetrically from the center and has a plurality of branches to increase heat transferring rate by increasing the number of branches of the heat transfer line 200.

Although not described so far, reference numerals 191 and 192 denotes a plurality of input/output terminals; reference numerals 193A to 193F denote channel blocks; reference numerals 194A to 194D denote power supplying units; reference numerals 156, 176, and 196 denote a plurality of resistance units; reference numerals 157, 177, and 197 denote a plurality of digital/analog controlling units; and reference numerals 198 and 199 denote a plurality of bumps.

Although the cases applying the COF technology are explained in the present invention, the present invention can be applied to the package process using a COG technology. Furthermore, the present invention can be applied to not only a source driver IC chip of a LCD but also a semiconductor chip including a plurality of power supplying units placed in the center of the semiconductor chip and used in all types of semiconductor devices. Moreover, the heat transfer lines illustrated in the second and third embodiments can be embodied in various types, and all types of films applied to this field including poly amid can be used. Also, the number of bumps is not limited.

In accordance with the present invention, bumps connected to a substrate and a well region are installed in regions where a plurality of power supplying units are formed, and a semiconductor chip is installed over a film substrate (or, a glass substrate) where a plurality of conductive interconnection lines are formed at portions corresponding to the bumps. Accordingly, it is possible to effectively emitting the heat generated from active devices through the bumps without causing any damages in the active devices of the semiconductor chip, thereby improving operation reliability of the chip.

The present application contains subject matter related to the Korean patent application No. KR 2005-0039197, filed in the Korean Patent Office on May 11, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device chip, comprising:
 a plurality of channel blocks each of which includes a plurality of channels, each of the channels including a plurality of unit devices placed in a substrate and a plurality of well regions arranged in the substrate;
 a plurality of first metal interconnection lines connected to the unit devices comprising the channels to receive and transfer data signals from and to the external side;
 a plurality of normal bumps for transferring the data signals received by the first metal interconnection lines through a plurality of first external interconnection lines to be connected to the external side;
 a plurality of second metal interconnection lines placed between the channel blocks, each of the second metal interconnection lines being connected to one of the substrate and a corresponding well region; and
 a plurality of first heat transfer bumps placed over the second metal interconnection lines to receive the heat generated during driving the channel blocks through the second metal interconnection lines and transfer the received heat to a plurality of second external interconnection lines to be connected to the external side.

2. The semiconductor device chip of claim 1, wherein the first heat transfer bumps includes:
 a plurality of 1-1 bumps respectively connected to metal interconnection lines connected to the substrate among the second metal interconnection lines; and
 a plurality of 1-2 bumps respectively connected to metal interconnection lines connected to the well regions among the second metal interconnection lines.

3. The semiconductor device chip of claim 2, further comprising:
 a power supplying unit for receiving one of a power voltage and a ground voltage through a power input terminal from the external side to drive the channel blocks;
 a plurality of third metal interconnection lines respectively connected to one of the substrate and the well regions of the channel blocks;
 a plurality of heat transfer lines respectively connected to the third metal interconnection lines;
 a plurality of first connection lines corresponding to the heat transfer lines, wherein each of the first connection line has one side connected to one side of a corresponding heat transfer line and the other side connected to the power input terminal;
 a plurality of second connection lines corresponding to the heat transfer lines, wherein each of the second connection lines is connected to the other side of the corresponding heat transfer line; and
 a plurality of second heat transfer bumps respectively connected to the second connection lines to transfer the heat received from the substrate and the well regions through the third metal interconnection lines, the heat transfer lines and the second connection lines.

4. The semiconductor device chip of claim 3, wherein the second heat transfer bumps are placed on edges of the semiconductor device chip.

5. The semiconductor device chip of claim 4, wherein the second heat transfer bumps are placed over a passivation layer region corresponding to where an input/output terminal for inputting and outputting the data signals is formed.

6. The semiconductor device chip of claim 5, wherein the heat transfer lines are arranged separately and independently from each other for each of the channel blocks or the heat transfer lines are electrically connected to each other throughout the channel blocks.

7. The semiconductor device chip of claim 6, wherein the heat transfer lines includes:
 a first heat transfer line connected to the substrate through one selected from the third metal interconnections; and
 a second heat transfer line electrically separated from the first heat transfer line and connected to a part of the well regions through one selected from the third metal interconnection lines.

8. The semiconductor device chip of claim 7, wherein the second heat transfer bumps includes:
 a 2-1 heat transfer bump connected to the first heat transfer line through one selected from the first connection lines; and
 a 2-2 heat transfer bump connected to the second heat transfer line through one selected from the second connection lines.

9. The semiconductor device chip of claim 8, wherein the third metal interconnection lines includes:
   a 3-1 metal interconnection line connected to the substrate; and
   a 3-2 metal interconnection line electrically isolated from the 3-1 metal interconnection line and connected to the well region.

10. The semiconductor device chip of claim 5, further comprising:
    a plurality of fourth metal interconnection lines respectively connected to one of the substrate and the well regions arranged in the channel blocks; and
    a plurality of third heat transfer bumps connected to the fourth metal interconnection lines to receive the heat generated during driving the channel blocks through the fourth metal interconnection lines and transfer the received heat to a plurality of third external interconnection lines to be connected to the external side.

11. The semiconductor device chip of claim 10, wherein the channel blocks include:
    latch units for latching the data signals inputted through input terminals;
    a digital/analog (D/A) converter for converting digital signals outputted from the latch units to analog signals; and
    an output circuit unit for amplifying and outputting the analog signals.

12. The semiconductor device chip of claim 3, wherein the second metal interconnection lines includes:
    a plurality of 2-1 metal interconnection lines for receiving one of the power voltage and the ground voltage transferred from the power supplying unit and providing one of the received power voltage and the received ground voltage to one of the substrate and the well regions; and
    a plurality of 2-2 metal interconnection lines of which one sides are connected to one of the substrate and the well regions, and the other sides are connected to the first heat transfer bumps.

13. The semiconductor device chip of claim 12, wherein the number of the 2-1 metal interconnection lines is identical to that of the 2-2 metal interconnection lines are same.

14. A semiconductor device chip, comprising:
    a plurality of channel blocks each of which includes a plurality of channels, each of the channels including a plurality of unit devices placed in a substrate and a plurality of well regions arranged in the substrate;
    a plurality of first metal interconnection lines connected to the unit devices comprising the channels to receive and transfer data signals from and to the external side;
    a plurality of normal bumps for transferring the data signals received by the first metal interconnection lines through a plurality of first external interconnection lines to be connected to the external side;
    a power supplying unit for receiving one of a power voltage and a ground voltage through a power input terminal from the external side to drive the channel blocks;
    a plurality of second metal interconnection lines respectively connected to one of the substrate and the well regions of the channel blocks;
    a plurality of heat transfer lines respectively connected to the second metal interconnection lines;
    a plurality of first connection lines corresponding to the heat transfer lines, wherein each of the first connection line has one side connected to one side of a corresponding heat transfer line and the other side connected to the power input terminal;
    a plurality of second connection lines corresponding to the heat transfer lines, wherein each of the second connection lines is connected to the other side of the corresponding heat transfer line; and
    a plurality of first heat transfer bumps respectively connected to the second connection lines to transfer the heat received from the substrate and the well regions through the second metal interconnection lines, the heat transfer lines and the second connection lines.

15. The semiconductor device chip of claim 14, wherein the second heat transfer bumps are placed on edges of the semiconductor device.

16. The semiconductor device chip of claim 15, wherein the first heat transfer bumps are placed over a passivation layer region corresponding to where an input/output terminal for inputting and outputting the data signals is formed.

17. The semiconductor device chip of claim 16, wherein the heat transfer lines are arranged separately and independently from each other for each of the channel blocks or the heat transfer lines are electrically connected to each other throughout the channel blocks.

18. The semiconductor device chip of claim 17, wherein the second metal interconnection lines includes:
    a 2-1 metal interconnection line connected to the substrate; and
    a 2-2 metal interconnection line electrically isolated from the 2-1 metal interconnection line and connected to the well region.

19. The semiconductor device chip of claim 18, wherein the heat transfer lines includes:
    a first heat transfer line connected to the substrate through the 2-1 metal interconnection line; and
    a second heat transfer line electrically separated from the first heat transfer line and connected to the well region through the 2-2 metal interconnection line.

20. The semiconductor device chip of claim 19, wherein the first heat transfer bumps includes:
    a 1-1 heat transfer bump connected to a 2-1 connection line connected to the first heat transfer line; and
    a 1-2 heat transfer bump connected to a 2-2 connection line connected to the second heat transfer line, wherein the 2-1 heat transfer bump and the 2-2 heat transfer bump are electrically isolated from each other.

21. The semiconductor device chip of claim 20, further comprising:
    a plurality of third metal interconnection lines respectively connected to one of the substrate and the well regions of the channel blocks; and
    a plurality of third heat transfer bumps connected to the third metal interconnection lines to receive the heat generated during driving the channel blocks through the third metal interconnection lines and transfer the received heat to a plurality of third external interconnection lines to be connected to the external side.

22. The semiconductor device chip of claim 21, wherein the channel blocks include:
    latch units for latching the data signals inputted through the input terminals;
    a digital/analog (D/A) converter for converting digital signals outputted from the latch units to analog signals; and
    an output circuit unit for amplifying and outputting the analog signals.

23. A semiconductor device chip, comprising:
a plurality of channel blocks each of which includes a plurality of channels, each of the channels including a plurality of unit devices placed in a substrate and a plurality of well regions arranged in the substrate;
a plurality of first metal interconnection lines connected to the unit devices comprising the channels to receive and transfer data signals from and to the external side;
a plurality of normal bumps for transferring the data signals received by the first metal interconnection lines through a plurality of first external interconnection lines to be connected to the external side;
a plurality of second metal interconnection lines placed between the channel blocks, each of the second metal interconnection lines being connected to one of the substrate and a corresponding well region; and
a plurality of first heat transfer bumps placed over the channel blocks, connected to the second metal interconnection lines, and transferring the heat received from one of the substrate and the well regions through a plurality of first external interconnection lines to be connected to the external side.

24. The semiconductor device chip of claim 23, wherein the first heat transfer bumps includes:
a plurality of 2-1 bump respectively connected to metal interconnection lines connected to the substrate among the second metal interconnection lines; and
a plurality of 2-2 bumps respectively connected to metal interconnection lines connected to the well regions among the second metal interconnection lines.

25. The semiconductor device chip of claim 24, further comprising:
a power supplying unit for receiving one of a power voltage and a ground voltage through a power input terminal from the external side to drive the channel blocks;
a plurality of third metal interconnection lines respectively connected to one of the substrate and the well regions of the channel blocks;
a plurality of heat transfer lines connected to the third metal interconnection lines;
a plurality of first connection lines corresponding to the heat transfer lines, wherein each of the first connection line is connected to the heat transfer lines corresponding to the power input terminal;
a plurality of second connection lines corresponding to the heat transfer lines, wherein each of the second connection lines is connected to the other side of the corresponding heat transfer line; and
a plurality of second heat transfer bumps respectively connected to the second connection lines to transfer the heat received from the substrate and the well regions through the third metal interconnection lines, the heat transfer lines and the second connection lines.

26. The semiconductor device chip of claim 25, wherein the second heat transfer bumps are placed on edges of the semiconductor device chip.

27. The semiconductor device chip of claim 26, wherein the second heat transfer bumps are placed over an upper portion of a passivation layer region where an input/output terminal for inputting and outputting the data signals is formed.

28. The semiconductor device chip of claim 27, wherein the heat transfer lines are arranged separately and independently from each other for each of the channel blocks or the heat transfer lines are electrically connected to each other throughout the channel blocks.

29. The semiconductor memory device of claim 28, wherein the third metal interconnection lines include:
a 3-1 metal interconnection line connected to the substrate; and
a 3-2 metal interconnection line electrically isolated from the 3-1 metal interconnection line and connected to the well region.

30. The semiconductor device chip of claim 29, wherein the heat transfer lines includes:
a first heat transfer line connected to the substrate through the 3-1 metal interconnection line; and
a second heat transfer line electrically separated from the first heat transfer line and connected to parts of the well regions through the 3-2 metal interconnection line.

31. The semiconductor device chip of claim 30, wherein the second heat transfer bumps includes:
a 2-1 heat transfer bump connected to a 2-1 connection line connected to the first heat transfer line;
a 2-2 heat transfer bump connected to a 2-2 connection line connected to the second heat transfer line, wherein the 2-1 heat transfer bump and the 2-2 heat transfer bump are electrically isolated from each other.

32. The semiconductor device chip of claim 31, wherein the channel blocks include:
latch units for latching the data signals inputted through input terminal;
a digital/analog (D/A) converter for converting digital signals outputted from the latch units to analog signals; and
an output circuit unit for amplifying and outputting the analog signals.

33. The semiconductor device chip of claim 23, wherein the second metal interconnection lines includes:
a plurality of 2-1 metal interconnection lines for receiving one of the power voltage and the ground voltage transferred from the power supplying unit and providing one of the received power voltage and the received ground voltage to one of the substrate and the well region; and
a plurality of 2-2 metal interconnection lines of which one sides are connected to one of the substrate and the well regions, and the other sides are connected to the first heat transfer bumps.

34. The semiconductor device chip of claim 33, wherein the number of the 2-1 metal interconnection lines is identical to that of the 2-2 metal interconnection lines are same.

35. A semiconductor chip device, comprising:
a plurality of channel blocks each of which includes a plurality of channels, each of the channels including a plurality of unit devices placed in a substrate and a plurality of well regions arranged in the substrate;
a plurality of first metal interconnection lines connected to the unit devices comprising the channels to receive and transfer data signals from and to the external side;
a plurality of normal bumps for transferring the data signals received by the first metal interconnection lines through a plurality of first external interconnection lines to be connected to the external side;
a plurality of second metal interconnection lines placed between the channel blocks, each of the second metal interconnection lines being connected to one of the substrate and a corresponding well region;
a plurality of first heat transfer bumps placed over the second metal interconnection lines to receive the heat generated during driving the channel blocks through the second metal interconnection lines and transfer the received heat to a plurality of second external interconnection lines to be connected to the external side; and a supporting substrate including the first external interconnection lines and the second external interconnection lines connected to the first heat transfer bumps.

36. The semiconductor device chip of claim 35, wherein the first external interconnection lines and the second external interconnection lines are thin copper film interconnection lines.

37. The semiconductor device chip of claim 35, wherein the supporting substrate is one of a film and a glass substrate.

38. The semiconductor device chip of claim 35, wherein the supporting substrate is a substrate used in one selected from the group consisting of a chip on film (COF) technology, a chip on glass (COG) technology and a taper carrier package (TCP) technology.

39. A semiconductor device chip, comprising:
a plurality of channel blocks each of which includes a plurality of channels, each of the channels including a plurality of unit devices placed in a substrate and a plurality of well regions arranged in the substrate;
a plurality of first metal interconnection lines connected to the unit devices comprising the channels to receive and transfer data signals from and to the external side;
a plurality of normal bumps for transferring the data signals received by the first metal interconnection lines through a plurality of first external interconnection lines to be connected to the external side;
a power supplying unit for receiving one of a power voltage and a ground voltage through a power input terminal from the external side to drive the channel blocks;
a plurality of second metal interconnection lines respectively connected to one of the substrate and the well regions of the channel blocks;
a plurality of heat transfer lines respectively connected to the second metal interconnection lines;
a plurality of first connection lines corresponding to the heat transfer lines, wherein each of the first connection line has one side connected to one side of a corresponding heat transfer line and the other side connected to the power input terminal;
a plurality of second connection lines corresponding to the heat transfer lines, wherein each of the second connection lines is connected to the other side of the corresponding heat transfer line;
a plurality of first heat transfer bumps respectively connected to the second connection lines to transfer the heat received from the substrate and the well regions to a plurality of second external interconnection lines through the second metal interconnection lines, the heat transfer lines and the second connection lines; and
a supporting substrate including the first external interconnection lines and the second external interconnection lines respectively connected to the first heat transfer bumps.

40. The semiconductor device chip of claim 39, wherein the first external interconnection lines and the second external interconnection liens are thin copper film interconnection lines.

41. The semiconductor device chip of claim 39, wherein the supporting substrate is one of a film and a glass substrate.

42. The semiconductor device chip of claim 39, wherein the supporting substrate is a substrate used in one selected from the group consisting of a chip on film (COF) technology, a chip on glass (COG) technology and a taper carrier package (TCP) technology.

43. A semiconductor device chip, comprising:
a plurality of channel blocks each of which includes a plurality of channels, each of the channels including a plurality of unit devices placed in a substrate and a plurality of well regions arranged in the substrate;
a plurality of first metal interconnection lines connected to the unit devices comprising the channels to receive and transfer data signals from and to the external side;
a plurality of normal bumps for transferring the data signals received by the first metal interconnection lines through a plurality of first external interconnection lines to be connected to the external side;
a power supplying unit for receiving one of a power voltage and a ground voltage through a power imputer terminal from the external side to drive the channel blocks;
a plurality of second metal interconnection placed between the channel blocks, each of the second metal interconnection lines being connected to one of the substrate and the corresponding well region;
a plurality of heat transfer bumps placed over the channel blocks and respectively connected to the second metal interconnection lines to transfer the heat transferred from the substrate and the well regions through the second metal interconnection lines; and
a supporting substrate including the first external interconnection lines and the second external interconnection line connected to the first heat transfer bumps.

44. The semiconductor device chip of claim 43, wherein the first external interconnection lines and the second external interconnection liens are thin copper film interconnection lines.

45. The semiconductor device chip of claim 43, wherein the supporting substrate is one of a film and a glass substrate.

46. The semiconductor device chip of claim 43, wherein the supporting substrate is a substrate used in one selected from the group consisting of a chip on film (COF) technology, a chip on glass (COG) technology and a taper carrier package (TCP) technology.

* * * * *